US011699656B2

(12) United States Patent
Yen et al.

(10) Patent No.: US 11,699,656 B2
(45) Date of Patent: Jul. 11, 2023

(54) TANK CIRCUIT STRUCTURE AND METHOD OF MAKING THE SAME

(71) Applicant: TAIWAN SEMICONDUCTOR MANUFACTURING COMPANY, LTD., Hsinchu (TW)

(72) Inventors: Hsiao-Tsung Yen, Hsinchu (TW); Cheng-Wei Luo, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 85 days.

(21) Appl. No.: 17/365,593

(22) Filed: Jul. 1, 2021

(65) Prior Publication Data

US 2021/0327809 A1     Oct. 21, 2021

Related U.S. Application Data

(60) Continuation of application No. 16/905,049, filed on Jun. 18, 2020, now Pat. No. 11,088,071, which is a division of application No. 15/078,387, filed on Mar. 23, 2016, now Pat. No. 10,720,387, which is a continuation of application No. 14/062,924, filed on Oct. 25, 2013, now Pat. No. 9,754,874.

(51) Int. Cl.
| | |
|---|---|
| *H01L 23/522* | (2006.01) |
| *H01L 21/822* | (2006.01) |
| *H01L 23/66* | (2006.01) |
| *H01L 25/065* | (2023.01) |
| *H01L 27/06* | (2006.01) |
| *H01L 23/48* | (2006.01) |

(52) U.S. Cl.
CPC ...... *H01L 23/5227* (2013.01); *H01L 21/8221* (2013.01); *H01L 23/5223* (2013.01); *H01L 23/5225* (2013.01); *H01L 23/5226* (2013.01); *H01L 23/66* (2013.01); *H01L 25/065* (2013.01); *H01L 25/0657* (2013.01); *H01L 27/0694* (2013.01); *H01L 23/481* (2013.01); *H01L 2223/6622* (2013.01); *H01L 2225/06527* (2013.01); *H01L 2225/06537* (2013.01); *H01L 2225/06541* (2013.01); *H01L 2924/0002* (2013.01)

(58) Field of Classification Search
CPC ............. H01L 23/5225; H01L 23/5226; H01L 23/5227; H01L 2225/06537; H01L 21/8221; H01L 25/0657
See application file for complete search history.

(56) References Cited

U.S. PATENT DOCUMENTS

| | | |
|---|---|---|
| 5,329,225 A | 7/1994 | Roshen |
| 6,549,258 B1 | 4/2003 | Shin et al. |
| 6,717,054 B2 | 4/2004 | Rolston et al. |
| 7,266,867 B2 | 9/2007 | Shen et al. |
| 7,602,264 B2 | 10/2009 | Tou et al. |

(Continued)

*Primary Examiner* — Antonio B Crite
(74) *Attorney, Agent, or Firm* — Hauptman Ham, LLP

(57) ABSTRACT

A tank circuit structure includes a first gate layer, a first substrate, a first shielding layer, a first inductor, a second inductor and a first inter metal dielectric (IMD) layer. The first substrate is over the first gate layer. The first shielding layer is over the first gate layer. The first inductor is over the first shielding layer. The second inductor is below the first substrate. The first IMD layer is between the first substrate and the first shielding layer.

20 Claims, 16 Drawing Sheets

(56) References Cited

U.S. PATENT DOCUMENTS

| | | |
|---|---|---|
| 7,646,440 B2 | 1/2010 | Cheng et al. |
| 8,243,030 B2 | 8/2012 | Jiang et al. |
| 2005/0275061 A1 | 12/2005 | Ohguro |
| 2007/0052062 A1 | 3/2007 | Ding |
| 2008/0020488 A1 | 1/2008 | Clevenger |
| 2013/0168810 A1* | 7/2013 | Cho .................... H01L 23/5225 257/531 |
| 2014/0264733 A1 | 9/2014 | Yuan |

* cited by examiner

TANK CIRCUIT STRUCTURE AND METHOD OF MAKING THE SAME

PRIORITY CLAIM

The present application is a continuation of U.S. application Ser. No. 16/905,049, filed Jun. 18, 2020, now U.S. Pat. No. 11,088,071, issued Aug. 10, 2021, which is a divisional of U.S. application Ser. No. 15/078,387, filed Mar. 23, 2016, now U.S. Pat. No. 10,720,387, issued Jul. 21, 2020, which is a continuation of U.S. application Ser. No. 14/062,924, filed Oct. 25, 2013, now U.S. Pat. No. 9,754,874, issued Sep. 5, 2017, which are incorporated herein by reference in their entireties.

BACKGROUND

Inductors are used in circuits to help regulate current flow through the circuit. When a current flows through the inductor, energy is stored temporarily in a magnetic field in the inductor. When the current flowing through the inductor changes, a time-varying magnetic field within the inductor induces a voltage in the inductor which opposes the change in current that created the magnetic field.

As technology nodes shrink, circuit sizes are reduced. Inductors occupy a large area in a circuit design. As the circuit size decreases, proximity between the inductor or capacitor and the other devices increases. Furthermore, as metal lines in these components decrease in size, a resistance in the metal lines increases. The increased resistance in turn lowers the quality (Q) factor of the inductors. In addition, inductors cause a magnetic flux to pass through the circuit. The magnetic flux is capable of introducing noise into other devices within the circuit.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

Figure 1A:
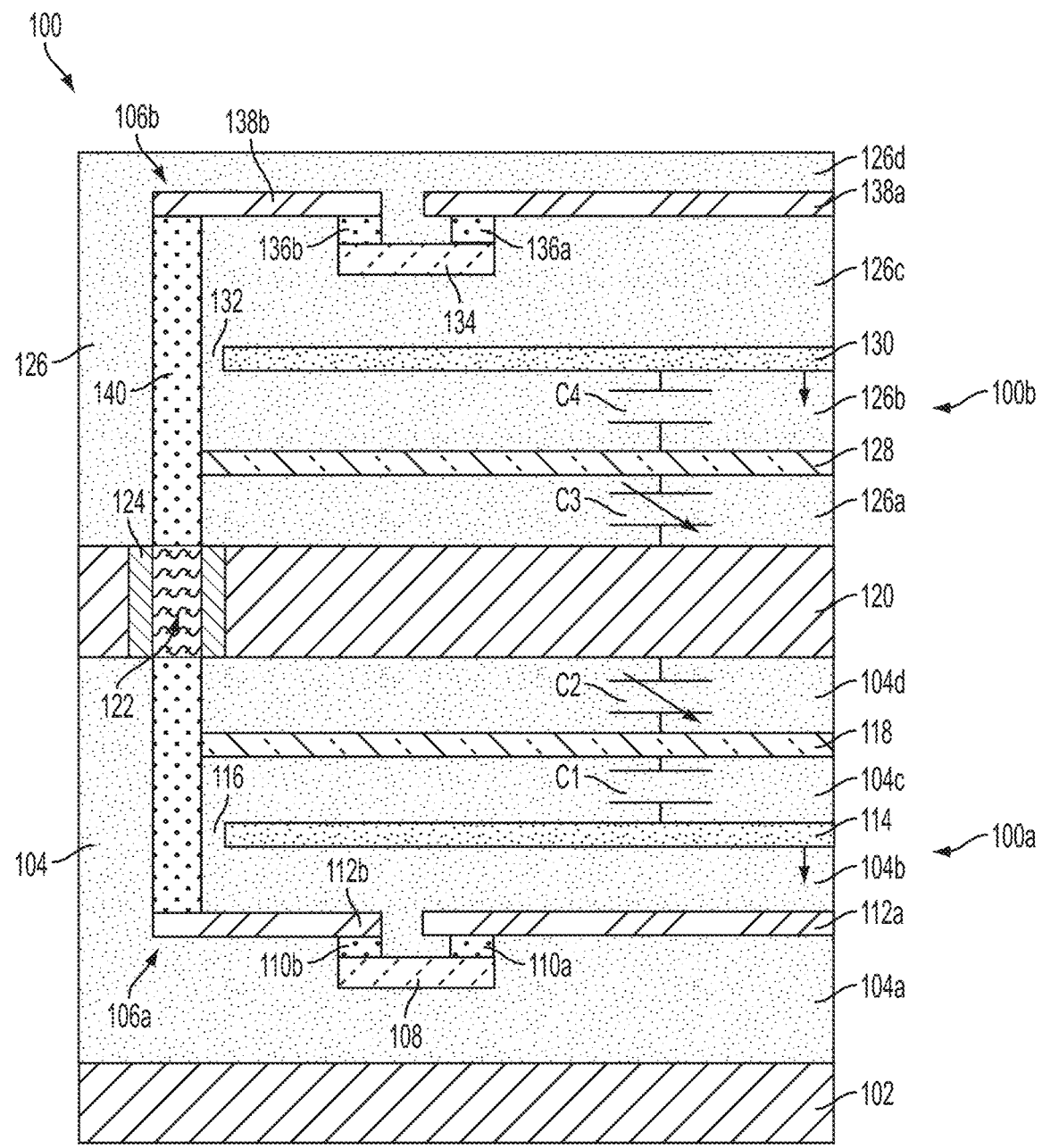
FIG. 1A is a cross sectional view of an inductive capacitive (LC) structure in accordance with one or more embodiments.

The following disclosure provides many different embodiments, or examples, for implementing different features of the disclosed subject matter. Specific examples of components and arrangements are described below to simplify the present disclosure. These are examples and are not intended to be limiting.

This description of the embodiments is intended to be read in connection with the accompanying drawings, which are to be considered part of the entire written description. In the description, relative terms such as "before," "after," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the system be constructed or operated in a particular orientation. Terms concerning attachments, coupling and the like, such as "connected" and "interconnected," refer to a relationship wherein components are attached to one another either directly or indirectly through intervening components, unless expressly described otherwise.

FIG. 1A is a cross sectional view of an inductive capacitive (LC) structure 100 in accordance with one or more embodiments. LC structure 100 includes a first substrate 102, a second substrate 120, a first conductive line 106a, a second conductive line 106b, a first shielding layer 114, a second shielding layer 130, a first gate layer 118, a second gate layer 128, a switch 122, a first inter-metal dielectric (IMD) layer 104 and a second IMD layer 126. In some embodiments, LC structure 100 is in a stacked configuration with a first LC tank circuit structure 100a located below the second substrate 120, and a second LC tank circuit structure 100b located above the second substrate 120. In some embodiments, first LC tank circuit structure 100a and second LC tank circuit structure 100b operate in a differential mode. In some embodiments, first LC tank circuit structure 100a comprises first substrate 102, first IMD layer 104, first conductive line 106a, first shielding layer 114 and first gate layer 118. In some embodiments, second LC tank circuit structure 100b comprises second substrate 120, second IMD layer 126, second conductive line 106b, second shielding layer 130 and second gate layer 128.

LC structure 100 includes a first substrate 102 and a first IND layer 104 over the first substrate 102. A first conductive line 106a, a first shielding layer 114 and a first gate layer 118 are each in first IMD layer 104. In some embodiments, first IMD layer 104 is a multi-layer material. In some embodiments, first IMD layer 104 comprises first IMD layers 104a, 104b, 104c, and 104d. LC structure 100 includes a first conductive line 106a in first IMD layer 104a. The first conductive line 106a and first IND layer 104a are over the first substrate 102. LC structure 100 includes a first IMD layer 104b over the first conductive line 106a and a first shielding layer 114 in first IMD layer 104b. The first shielding layer 114 is over the first conductive line 106a. LC structure 100 includes a first IMD layer 104c over the first shielding layer 114 and a first gate layer 118 in first IMD layer 104c. The first gate layer 118 is over the first shielding layer 114. LC structure 100 includes a first recess portion 116 which connects first IND layer 104b and first IMD layer 104c. In some embodiments, the first shielding layer 114 is separated from a conductive line 140 by the first recess portion 116. LC structure 100 includes first IND layer 104d over the first gate layer 118 and a second substrate 120 over first IND layer 104d.

LC structure 100 includes a second substrate 120 over first substrate 102 and first IND layer 104. LC structure 100 includes a second IMD layer 126 over the second substrate 120. A second conductive line 106b, a second shielding layer 130 and a second gate layer 128 are in second IMD layer 126. In some embodiments, second IND layer 126 is a multi-layer material. In some embodiments, second IND layer 126 comprises second IMD layers 126a, 126b, 126c, and 126d. LC structure 100 includes a second gate layer 128 in second IND layer 126a. The second gate layer 128 and second IMD layer 126a are over the second substrate 120. LC structure 100 includes a second IND layer 126b over the second gate layer 128 and a second shielding layer 130 in second IMD layer 126b. The second shielding layer 130 is over the second gate layer 128. LC structure 100 includes a second IMD layer 126c over the second shielding layer 130 and a second conductive line 106b in second IMD layer 126c. The second conductive line 106b is over the second shielding layer 130. LC structure 100 includes a second recess portion 132 which connects second IMD layer 126b and second IMD layer 126c. In some embodiments, the second shielding layer 130 is separated from the conductive line 140 by the second recess portion 132. LC structure 100 includes a second IMD layer 126d over the second conductive line 106b. In some embodiments, the second IMD layer 126d is omitted. Conductive line 140 electrically connects first conductive line 106a and second conductive line 106b through second substrate 120. A switch 122 is formed in second substrate 120 to selectively connect different portions of first conductive line 106a and second conductive line 106b. An insulator 124 is formed in second substrate 120 to electrically isolate conductive line 140 from second substrate 120. In some embodiments, insulator 124 includes a dielectric material including oxide or another suitable insulating material.

In some embodiments, first substrate 102 includes an elemental semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, first substrate 102 is a strained SiGe substrate. In some embodiments, the semiconductor substrate has a semiconductor on insulator structure, such as a silicon on insulator (SOI) structure. In some embodiments, the semiconductor substrate includes a doped epi layer or a buried layer. In some embodiments, the compound semiconductor substrate has a multilayer structure, or the substrate includes a multilayer compound semiconductor structure. In some embodiments, a thickness of first substrate ranges from about 30 microns (μm) to about 50 μm.

In some embodiments, first IMD layer 104 is a multi-layer material having conductive lines extending in a plane parallel to a top surface of first substrate 102 in each layer and conductive vias connecting conductive lines on separate layers in the first IMD layer. First WM layer 104 includes a dielectric material configured to insulate the conductive lines or conductive vias. In some embodiments, first IMD layer 104 includes an interconnect structure configured to electrically connect active devices in or on first substrate 102. In some embodiments, the dielectric material of first IMD layer 102 includes a low-k dielectric material. A low-k dielectric material has a dielectric constant less than that of silicon dioxide. In some embodiments, first IMD layer 104 comprises a plurality of layers. In some embodiments, first IMD layer 104 comprises first IMD layers 104a, 104b, 104c, and 104d. In some embodiments, first IMD layer 104 includes a dielectric material including oxide or another suitable insulating material.

First conductive line 106a includes conductive lines in first IMD layer 104. In some embodiments, first conductive line 106a is in a two-dimensional plane in first IMD layer 104. In some embodiments, first conductive line 106a is positioned in a two-dimensional plane which is parallel to first shielding layer 114. In some embodiments, first conductive line 106a is a three-dimensional structure in first IMD layer 104. The three-dimensional structure includes a combination of conductive lines on different layers of first IMD layer 104 and conductive vias connecting the conductive lines. First conductive line 106a includes a first straight conductive line 112a and a second straight conductive line 112b on a same level of first IMD layer 104. First conductive line 106a further includes a third straight conductive line 108 on a different level of first IMD layer 104. First conductive line 106a further includes a first conductive via 110a connecting first straight conductive line 112a to third straight conductive line 108; and a second conductive via 110b connecting second straight conductive line 112b to third straight conductive line 108. In some embodiments, first straight conductive line 112a and second straight conductive line 112b are on a level of first IMD layer 104 above third straight conductive line 108. In some embodiments, first straight conductive line 112a and second straight conductive line 112b are on a level of first IMD layer 104 below third straight conductive line 108. In some embodiments, first conductive line 106a includes a single port for either receiving or outputting an electrical current. In some embodiments, first conductive line 106a includes more than one port and is capable of both receiving and outputting an electrical current. In some embodiments, first conductive line 106a includes copper, aluminum, nickel, tungsten, titanium, or another suitable conductive material. In some embodiments, first conductive line is omitted and LC structure 100 includes only second conductive line 106b. In some embodiments, a thickness of first conductive line 106a ranges from about 0.1 μm to about 4 μm. In some embodiments, a depth of first straight conductive line 112a ranges from about 0.1 μm to about 4 μm. In some embodiments, first conductive line 106a includes one or more inductors with a range of inductances from about 0.5 (nanohenries) nH to about 10 nH.

In some embodiments, first conductive line 106a is a meandering type conductive winding in which a conductive line extends along an angled direction with respect to an x-axis and a y-axis of first IMD layer 104. Conductive lines in a same layer of first IMD layer 104 extend parallel to one another. Conductive lines in a different layer of first IMD layer 104 are arranged to allow electrical connection between the parallel conductive lines; and conductive vias connect the conductive lines on the different layers of the first IMD layer 104.

In some embodiments, first conductive line 106a is a spiral type conductive winding in which conductive lines are arranged in a spiral arrangement in different layers of first IMD layer 104. Conductive vias provide electrical connections between the conductive lines in the different layers of first IMD layer 104.

First shielding layer 114 includes a conductive material to isolate first conductive line 106a and second conductive line 106b. First shielding layer 114 reduces the mutual inductive coupling and capacitive coupling between first conductive line 106a and second conductive line 106b. In some embodiments, first shielding layer 114 is in a two-dimensional plane in first WM layer 104. In some embodiments, first shielding layer 114 is a three-dimensional structure in first IMD layer 104. In some embodiments, the orientation of the first shielding layer 114 is parallel to the first conductive line 106a and second conductive line 106b. In some embodiments, the first shielding layer 114 includes a conductive plate coupled to ground. In some embodiments, the first shielding layer 114 is a solid conductor with a plate-like shape. In some embodiments, the first shielding layer 114 includes a solid conductor with hole-like portions, formed therein, shaped in various patterns, such as rectangular, square, circular, hexagonal, or other geometric shapes.

First shielding layer 114 is electrically isolated from the conductive line 140 by the first recess portion 116. First recess portion 116 has a width between about 4 μm and about 30 μm. First shielding layer 114 has a thickness between about 0.1 μm and about 2 μm. In some embodiments, the thickness of the first shielding layer 114 is larger or smaller depending on design requirements for the LC structure 100. A larger thickness will provide greater protection from mutual inductive coupling and capacitive coupling. A smaller thickness will reduce the protection from mutual inductive coupling and capacitive coupling. In some embodiments, first shielding layer 114 includes copper, aluminum, nickel, tungsten, titanium, or another suitable conductive material. In some embodiments, first shielding layer 114 is omitted and LC structure 100 includes only second shielding layer 130. In some embodiments, first shielding layer 114 provides a range of attenuation from −0.1 dB to 2 dB over a range of frequencies from 10 gigahertz (GHz) to 30 GHz.

Capacitor C1 is the effective capacitance between the first shielding layer 114 and the first gate layer 118. In some embodiments, capacitor C1 is referred to as a Metal Oxide Metal Capacitor (MOMCAP). In some embodiments, the value of capacitor C1 is fixed. Capacitor C1 has a capacitance between about 30 femtofarads (fF) and about 3 picofarads (pF).

First gate layer 118 is formed in first IMD layer 104. First gate layer 118 is electrically connected to second gate layer 128 by conductive line 140. First gate layer 118 is a gate electrode where a first input signal to the lower portion of LC structure 100 is applied. First gate layer 118 includes a doped or non-doped polycrystalline silicon (or polysilicon). Alternatively, the first gate layer 118 includes a metal, such as Al, Cu, W, Ti, Ta, TiN, TaN, NiSi, CoSi, other suitable conductive materials, or combinations thereof, in some embodiments. In some embodiments, the first gate layer 118 is formed by chemical vapor deposition (CVD), physical vapor deposition (PVD), atomic layer deposition (ALD), plating, or other processes. In some embodiments, the first gate layer 118 has a multilayer structure and is formed in a multiple-step process. In some embodiments, first gate layer 118 is omitted and LC structure 100 includes only second gate layer 128.

First gate layer 118 has a thickness between about 0.1 μm and about 2 μm. In some embodiments, the thickness of the first gate layer 118 is larger or smaller depending on design requirements for the LC structure 100.

Capacitor C2 is the effective capacitance between the first gate layer 118 and the second substrate 120. In some embodiments, capacitor C2 is referred to as a Metal Oxide Substrate Capacitor (MOSCAP). The value of capacitor C2 is tunable based on a voltage of first input signal applied to the first gate layer 118. In some embodiments, the capacitance value of capacitor C2 is increased as the voltage applied to the first gate layer 118 is increased. In some embodiments, the capacitance value of capacitor C2 is decreased as the voltage applied to the first gate layer 118 is decreased. In some embodiments, the value of capacitor C2 is adjusted to tune the first LC tank circuit 100a of LC structure 100. Capacitor C2 has a capacitance between about 30 fF and about 3 pF.

Second substrate 120 is above first IMD layer 104 and first gate layer 118. Second substrate 120 is used to create a 3-Dimensional Integrated Circuit (3-D IC). In some embodiments, second substrate 120 is used to create a symmetric circuit structure positioned above and below the second substrate 120. In some embodiments, second substrate 120 is used to create a stacked, differential LC tank circuit structure which includes a first LC tank circuit structure located above the second substrate 120 and outputs a signal 180 degrees out of phase with an output of a second LC tank circuit structure positioned below the second substrate 120. In some embodiments, second substrate 120 is used to create asymmetric circuit structures positioned above and below the second substrate 120. In some embodiments, second substrate 120 is connected to ground (not shown). In some embodiments, second substrate 120 includes polysilicon, doped silicon, or other suitable conductive materials. In some embodiments, a thickness of second substrate 120 ranges from about 50 nanometers (nm) to about 150 nm. In some embodiments, the thickness of second substrate 120 ranges from about 150 nanometers (nm) to about 450 nm. In some embodiments, the thickness of second substrate 120 ranges from about 450 nanometers (nm) to about 850 nm. If the thickness of second substrate 120 is too great, forming conductive line 140 becomes difficult and the length of the conductive line 140 unnecessarily increases resistance in LC structure 100, in some embodiments.

In some embodiments, a separation between first conductive line 106a and second substrate 120 ranges from about 500 nm to about 1 μm. In some embodiments, the separation between first conductive line 106a and second substrate 120 ranges from about 1 μm to about 2 μm. In some embodiments, the separation between first conductive line 106a and second substrate 120 ranges from about 2 μm to about 5 μm. In some embodiments, the separation between first conductive line 106a and second substrate 120 ranges from about 5 µm to about 15 µm. If the separation is too small, first IMD layer 104 is not able to provide sufficient insulation between first conductive line 106a and second substrate 120, in some embodiments.

Second IMD layer 126 includes a dielectric material configured to insulate the conductive lines or conductive vias. In some embodiments, second IMD layer 126 is a multi-layer material having conductive lines extending in a plane parallel to a top surface of second substrate 120. In some embodiments, second IMD layer 126 is a multi-layer material having one or more conductive lines positioned in each layer of second IMD layer 126. In some embodiments, second IMD layer 126 is a multi-layer material having conductive vias connecting conductive lines in separate layers of the second IMD layer 126. In some embodiments, second IMD layer 126 includes an interconnect structure configured to electrically connect active devices in second substrate 120. The dielectric material in second IMD layer 126 is used to provide insulation between adjacent conductive lines or conductive vias. In some embodiments, the dielectric material of second IMD layer 126 includes a low-k dielectric material. In some embodiments, the dielectric material of second IMD layer 126 is a same dielectric material as first IND layer 104. In some embodiments, the dielectric material of second IMD layer 126 is different from the dielectric material of first IND layer 104. In some embodiments, second IMD layer 126 comprises a plurality of layers. In some embodiments, second IMD layer 126 comprises second IMD layers 126a, 126b, 126c, and 126d. In some embodiments, second IMD layer 126 includes a dielectric material including oxide or another suitable insulating material.

In some embodiments, a separation between second conductive line 106b and second substrate 120 ranges from about 1 µm to about 2 µm. In some embodiments, the separation between second conductive line 106b and second substrate 120 ranges from about 2 µm to about 5 µm. In some embodiments, the separation between second conductive line 106b and second substrate 120 ranges from about 5 µm to about 15 µm. If the separation is too small, second IMD layer 126 is not able to provide sufficient insulation between second conductive line 106b and second substrate 120, in some embodiments. In some embodiments, the separation between first conductive line 106a and second substrate 120 is equal to the separation between second conductive line 106b and the second substrate. In some embodiments, the separation between first conductive line 106a and second substrate 120 is different from the separation between second conductive line 106b and the second substrate.

Second gate layer 128 is in second IND layer 126. Second gate layer 128 is electrically connected to first gate layer 118 by conductive line 140. Second gate layer 128 is a gate electrode where a second input signal to the upper portion of LC structure 100 is applied. Second gate layer 128 includes a doped or non-doped polycrystalline silicon (or polysilicon). Alternatively, the second gate layer 128 includes a metal, such as Al, Cu, W, Ti, Ta, TiN, TaN, NiSi, CoSi, other suitable conductive materials, or combinations thereof, in some embodiments. In some embodiments, the second gate layer 128 is formed by CVD, PVD, ALD, plating, or other processes. In some embodiments, the second gate layer 128 has a multilayer structure and is formed in a multiple-step process. In some embodiments, second gate layer 128 is omitted and LC structure 100 includes only first gate layer 118.

Second gate layer 128 has a thickness between about 0.1 µm and about 2 µm. In some embodiments, the thickness of the second gate layer 128 is larger or smaller depending on design requirements for the LC structure 100.

Capacitor C3 is the effective capacitance between the second gate layer 128 and the second substrate 120. In some embodiments, capacitor C3 is referred to as a MOSCAP. The value of capacitor C3 is tunable based on a voltage of second input signal applied to the second gate layer 128. In some embodiments, the capacitance value of capacitor C3 is increased as the voltage applied to the second gate layer 128 is increased. In some embodiments, the capacitance value of capacitor C3 is decreased as the voltage applied to the second gate layer 128 is decreased. In some embodiments, the value of capacitor C3 is adjusted to tune the second LC tank circuit 300b of LC structure 100. Capacitor C3 has a capacitance between about 30 fF and about 3 pF.

Second shielding layer 130 includes a conductive material to isolate first conductive line 106a and second conductive line 106b. Second shielding layer 130 reduces the mutual inductive coupling and capacitive coupling between first conductive line 106a and second conductive line 106b. In some embodiments, second shielding layer 130 is in a two-dimensional plane in second IMD layer 126. In some embodiments, second shielding layer 130 is a three-dimensional structure in second IMD layer 126. In some embodiments, the orientation of the second shielding layer 130 is parallel to the first conductive line 106a and second conductive line 106b. In some embodiments, the second shielding layer 130 includes a conductive plate coupled to ground. In some embodiments, the second shielding layer 130 is a solid conductor with a plate-like shape. In some embodiments, the second shielding layer 130 includes a solid conductor with hole-like portions, formed therein, shaped in various patterns, such as rectangular, square, circular, hexagonal, or other geometric shapes.

Second shielding layer 130 is electrically isolated from the conductive line 140 by the second recess portion 132. Second recess portion 132 has a width between about 0.1 µm and about 5 µm. Second shielding layer 130 has a thickness between about 0.1 µm and about 4 µm. In some embodiments, the thickness of the second shielding layer 130 is larger or smaller depending on design requirements for the LC structure 100. A larger thickness will provide greater protection from mutual inductive coupling and capacitive coupling. A smaller thickness will reduce the protection from mutual inductive coupling and capacitive coupling. One of ordinary skill in the art will recognize the ability to select a desired thickness attuned to the design requirements of the LC structure 100. In some embodiments, second shielding layer 130 includes copper, aluminum, nickel, tungsten, titanium, or another suitable conductive material. In some embodiments, second shielding layer 130 is omitted and LC structure 100 includes only first shielding layer 114. In some embodiments, second shielding layer 134 provides a range of attenuation from _0.1 dB to 2 dB over a range of frequencies from 10 GHz to 30 GHz.

Capacitor C4 is the effective capacitance between the second gate layer 128 and the second shielding layer 130. In some embodiments, capacitor C4 is referred to as a MOMCAP. In some embodiments, the value of capacitor C4 is fixed. Capacitor C4 has a capacitance between about 30 fF and about 3 pF.

Second conductive line 106b includes conductive lines in second IMD layer 126. In some embodiments, second conductive line 106b is a conductive winding structure in a two-dimensional plane in second IMD layer 126. In some embodiments, second conductive line 106b is positioned in a two-dimensional plane which is parallel to second shielding layer 130. In some embodiments, second conductive line 106b is a three-dimensional conductive winding structure in second IMD layer 126. In some embodiments, second conductive line 106b includes a single port for either receiving or outputting an electrical current. Second conductive line 106b includes a first straight conductive line 138a and a second straight conductive line 138b on a same level of second IMD layer 126. Second conductive line 106b further includes a third straight conductive line 134 on a different level of second IMD layer 126. Second conductive line 106b further includes a first conductive via 136a connecting first straight conductive line 138a to third straight conductive line 134; and a second conductive via 136b connecting second straight conductive line 138b to third straight conductive line 134. In some embodiments, first straight conductive line 138a and second straight conductive line 138b are on a level of second IMD layer 126 above third straight conductive line 134. In some embodiments, first straight conductive line 138a and second straight conductive line 138b are on a level of second IMD layer 126 below third straight conductive line 134. In some embodiments, second conductive line 106b includes more than one port and is capable of both receiving and outputting an electrical current. In some embodiments, second conductive line 106b includes copper, aluminum, nickel, tungsten, titanium, or another suitable conductive material. In some embodiments, second conductive line 106b is omitted and LC structure 100 includes first conductive line 106a. In some embodiments, a shape of second conductive line 106b is a same shape as first conductive line 106a. In some embodiments, the shape of second conductive line 106b is different from first conductive line 106a. In some embodiments, a thickness of second conductive line 106b ranges from about 0.1 µm to about 4 µm. In some embodiments, a depth of second straight conductive line 138a ranges from about 0.5 µm to about 4 µm. In some embodiments, second conductive line 106b includes one or more inductors with a range of inductances from about 0.5 nH to about 10 nH.

In some embodiments, second conductive line 106b is a meandering type conductive winding in which a conductive line extends along an angled direction with respect to an x-axis and a y-axis of second IMD layer 126. Conductive lines in a same layer of second IMD layer 126 extend parallel to one another. Conductive lines in a different layer of second IMD layer 126 are arranged to allow electrical connection between the parallel conductive lines; and conductive vias connect the conductive lines on the different layers of the second IMD layer 126.

In some embodiments, second conductive line 106b is a spiral type conductive winding in which conductive lines are arranged in a spiral arrangement in different layers of second IMD layer 126. Conductive vias provide electrical connections between the conductive lines in the different layers of second IMD layer 126.

Conductive line 140 is used to electrically connect first conductive line 106a to second conductive line 106b. Conductive line 140 extends through second substrate 120. In some embodiments, conductive line 140 is a metal line, a via, a through silicon via (TSV), an inter-level via (ILV), or another suitable conductive line. In some embodiments, conductive line 140 includes copper, aluminum, nickel, titanium, tungsten or another suitable conductive material. In some embodiments, conductive line 140 is a same material as first conductive line 106a and second conductive line 106b. In some embodiments, conductive line 140 is a different material from first conductive line 106a or second conductive material 106b. In some embodiments, conductive line 140 is omitted to prevent direct electrical connection between first conductive line 106a and second conductive line 106b. Conductive line 140 is used to electrically connect first gate layer 118 and second gate layer 128. In some embodiments, conductive line 140 includes one or more conductive line portions.

Switch 122 is formed in second substrate 120 to selectively connect different portions of first conductive line 106a and second conductive line 106b. In some embodiments, switch 122 includes a plurality of transistors, such as metal-oxide-semiconductor (MOS) transistors, bi-polar junction transistors (BJTs), high electron mobility transistors (HEMTs), or other suitable switching elements. By independently activating switch 122, an inductance and Q factor of LC structure 100 is adjustable. In some embodiments, switch 122 is activated based on control signals received from a controller. In some embodiments, the control signals are generated in response to a user input. In some embodiments, the control signals are generated automatically in response to a detected current change. In some embodiments, in which switch 122 includes transistors, the control signal is applied to a gate of the switch 122 to selectively activate the switch 122. In some embodiments, switch 122 allows LC structure 100 to operate in a dual frequency band design. In some embodiments, switch 122 allows LC structure 100 to operate at 2.4 GHz and 5.8 GHz.

Figure 1B:
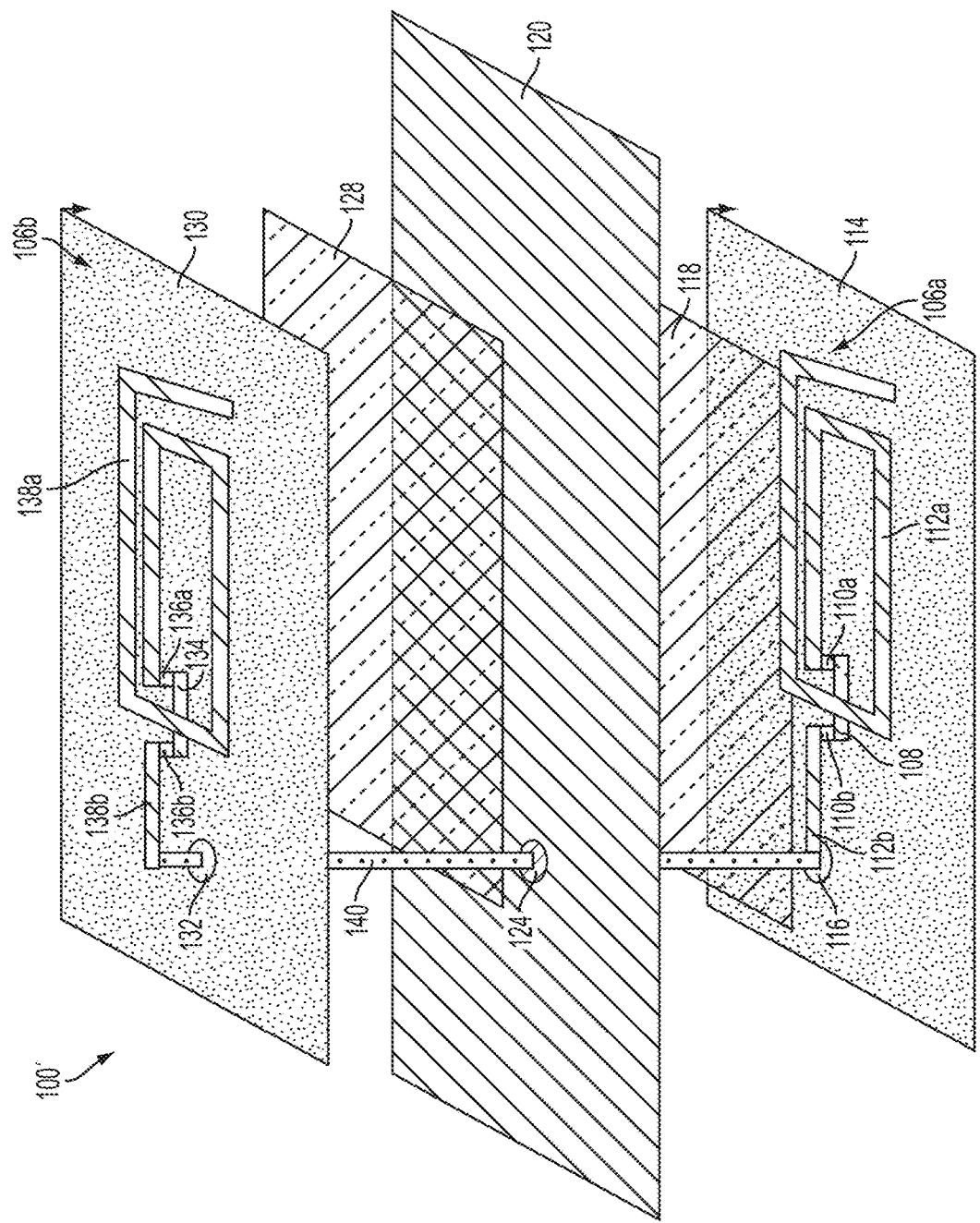
FIG. 1B is a perspective view of an LC structure in accordance with one or more embodiments.

FIG. 1B is a perspective view of an LC structure 100' in accordance with one or more embodiments. LC structure 100' is an embodiment of LC structure 100 with similar elements. As shown in FIG. 1B, similar elements have a same reference number as shown in FIG. 1A. LC structure 100' is an embodiment of LC structure 100 without substrate 102, first IMD layer 104 and second IMD layer 126 (for illustrative purposes).

Figure 2A:
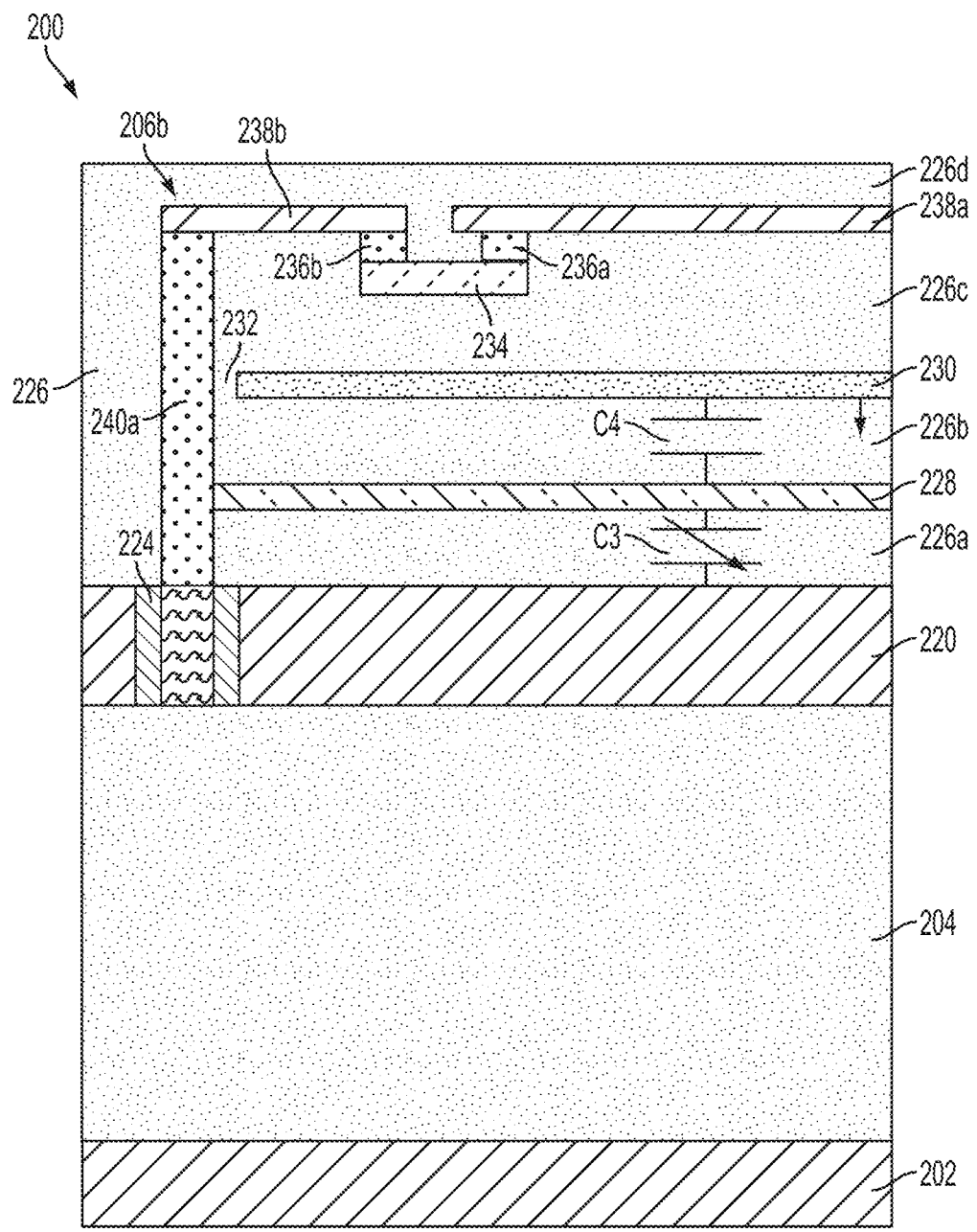
FIG. 2A is a cross sectional view of an LC structure in accordance with one or more embodiments.

FIG. 2A is a cross sectional view of an LC structure 200 in accordance with one or more embodiments. LC structure 200 is an embodiment of LC structure 100 (shown in FIG. 1A) with similar elements. As shown in FIG. 2A, similar elements have a same reference number as shown in FIG. 1A increased by 100. LC structure 200 includes second conductive line 206b, second shielding layer 230 and second gate layer 228 in second IMD layer 226. LC structure 200 includes conductive line 240a. Conductive line 240a is an embodiment of conductive line 140 shown in FIG. 1A. Conductive line 240a is used to electrically connect second conductive line 206b to second gate layer 228. In some embodiments, conductive line 240a extends into substrate 220 providing additional capacitance to LC structure 200.

Figure 2B:
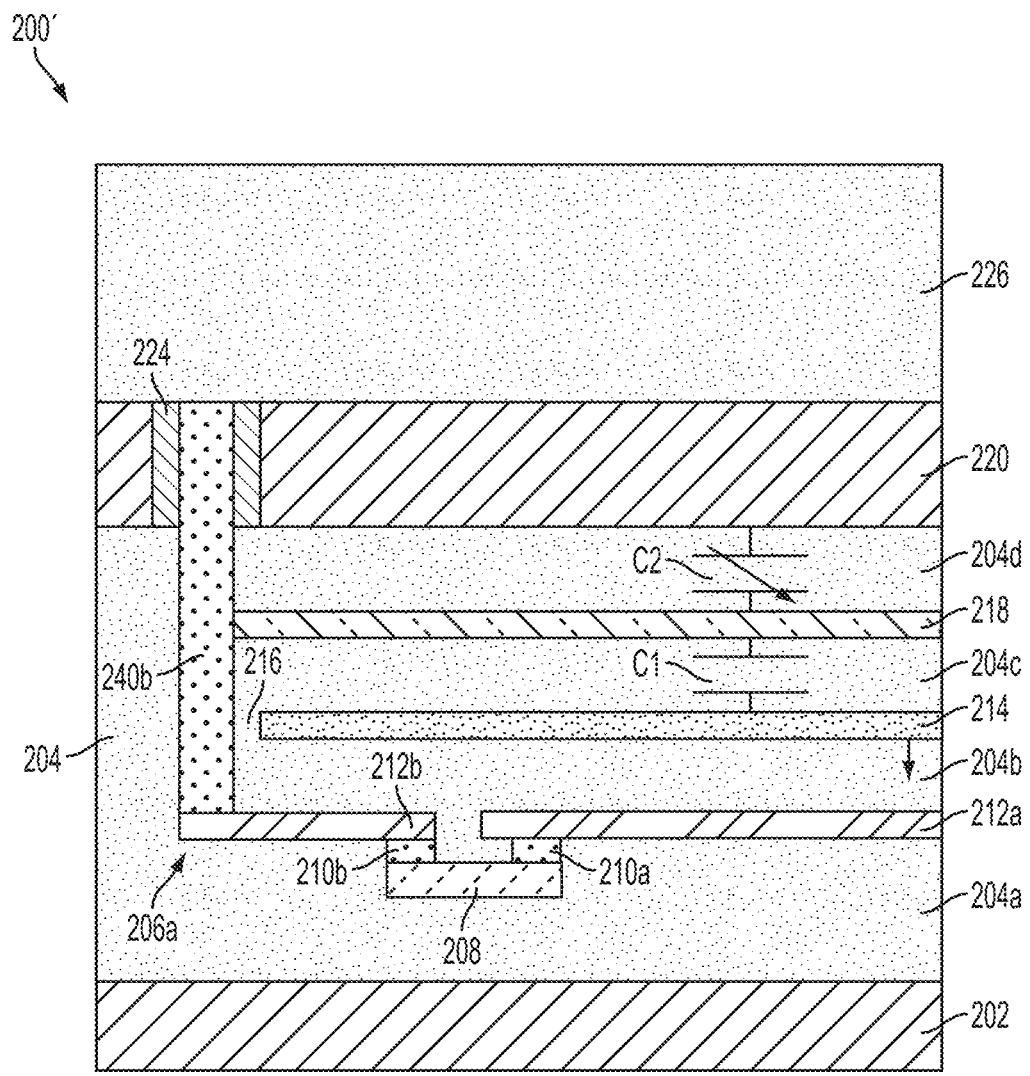
FIG. 2B is a cross sectional view of an LC structure in accordance with one or more embodiments.

FIG. 2B is a cross sectional view of an LC structure 200' in accordance with one or more embodiments. LC structure 200' is an embodiment of LC structure 100 (shown in FIG. 1A) with similar elements. As shown in FIG. 2B, similar elements have a same reference number as shown in FIG. 1A increased by 100. In comparison with LC structure 200 (shown in FIG. 2A), LC structure 200' does not include a second conductive line 206b, second shielding layer 230 and second gate layer 228 in a second IMD layer 226. LC structure 200' includes first conductive line 206a, first shielding layer 214 and first gate layer 218 in first IMD layer 204. LC structure 200' includes conductive line 240b. Conductive line 240b is an embodiment of conductive line 140 shown in FIG. 1A. Conductive line 240b is used to electrically connect first conductive line 206a to first gate layer 218. In some embodiments, conductive line 240b extends into substrate 220 providing additional capacitance to LC structure 200'.

Figure 3A:
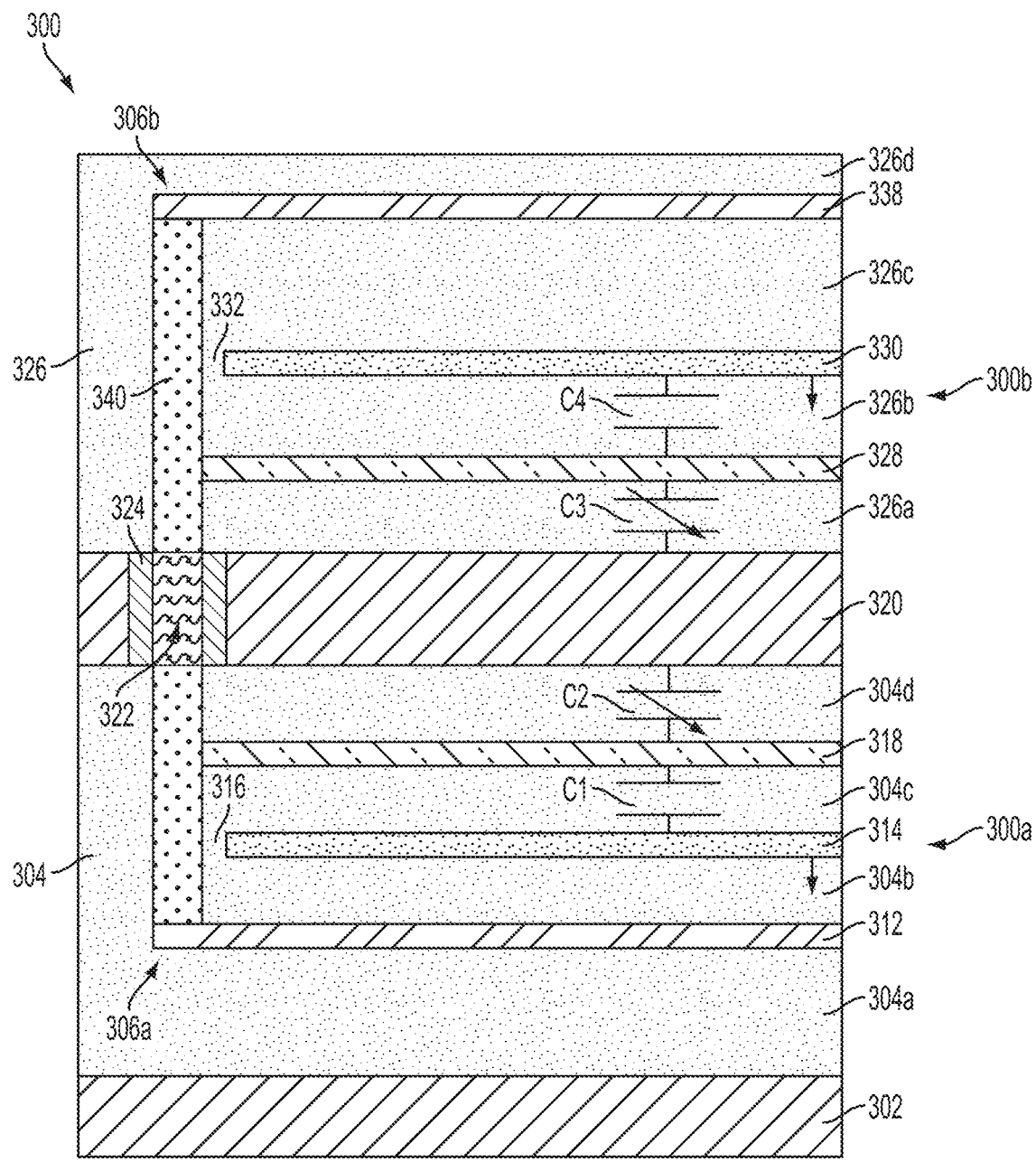
FIG. 3A is a cross sectional view of an LC transmission line structure in accordance with one or more embodiments.

FIG. 3A is a cross sectional view of an LC transmission line structure 300 in accordance with one or more embodiments. LC transmission line structure 300 is an embodiment of LC structure 100 (shown in FIG. 1A) with similar elements. As shown in FIG. 3, similar elements have a same reference number as shown in FIG. 1A increased by 200. LC transmission line structure 300 includes first conductive line 306a and second conductive line 306b. In comparison with LC structure 100 (shown in FIG. 1A), first conductive line 306a does not include first straight conductive line 112a, second straight conductive line 112b, third straight conductive line 108, first conductive via 110a, and second conductive via 110b. In comparison with LC structure 100 (shown in FIG. 1A), second conductive line 306b does not include first straight conductive line 138a, second straight conductive line 138b, third straight conductive line 134, first conductive via 136a, and second conductive via 136b. In some embodiments, LC transmission line structure 300 is in a stacked configuration with a first LC transmission line structure 300a located below the second substrate 320, and a second LC transmission line structure 300b located above the second substrate 320. In some embodiments, first LC transmission line structure 300a and second LC transmission line structure 300b operate in a differential mode.

First conductive line 306a includes lower conductive line 312 in first IMD layer 304. In some embodiments, first conductive line 306a includes one or more lower conductive lines in first IMD layer 304. In some embodiments, lower conductive line 312 is a transmission line structure. In some embodiments, lower conductive line 312 is a conductive structure in a two-dimensional plane in first IMD layer 304. In some embodiments, lower conductive line 312 is a three-dimensional conductive structure in first IMD layer 304. In some embodiments, lower conductive line 312 is parallel to first shielding layer 314. In some embodiments, lower conductive line 312 includes a single port for either receiving or outputting an electrical current. In some embodiments, lower conductive line 312 includes more than one port and is capable of both receiving and outputting an electrical current. In some embodiments, lower conductive line 312 is capable of both receiving and outputting an electrical signal with a frequency range of about 10 GHz to about 30 GHz. In some embodiments, lower conductive line 312 includes copper, aluminum, nickel, tungsten, titanium, or another suitable conductive material. In some embodiments, lower conductive line 312 is omitted and LC transmission line structure 300 includes upper conductive line 338. In some embodiments, a shape of lower conductive line 312 is a same shape as upper conductive line 338. In some embodiments, the shape of lower conductive line 312 is different from upper conductive line 338. In some embodiments, a thickness of lower conductive line 312 ranges from about 0.1 µm to about 4 µm. In some embodiments, a depth of lower conductive line 312 ranges from about 0.1 µm to about 4 µm.

Second conductive line 306b includes upper conductive line 338 in second IMD layer 326. In some embodiments, second conductive line 306b includes one or more upper conductive lines in second IMD layer 326. In some embodiments, upper conductive line 338 is a transmission line structure. In some embodiments, upper conductive line 338 is a conductive structure in a two-dimensional plane in second IMD layer 326. In some embodiments, upper conductive line 338 is a three-dimensional conductive structure in second IMD layer 326. In some embodiments, upper conductive line 338 is parallel to second shielding layer 330. In some embodiments, upper conductive line 338 includes a single port for either receiving or outputting an electrical current. In some embodiments, upper conductive line 338 includes more than one port and is capable of both receiving and outputting an electrical current. In some embodiments, upper conductive line 338 is capable of both receiving and outputting an electrical signal with a frequency range of about 10 gigahertz (GHz) to about 30 GHz. In some embodiments, upper conductive line 338 includes copper, aluminum, nickel, tungsten, titanium, or another suitable conductive material. In some embodiments, upper conductive line 338 is omitted and LC transmission line structure 300 includes only lower conductive line 312. In some embodiments, a shape of upper conductive line 338 is a same shape as lower conductive line 312. In some embodiments, the shape of upper conductive line 338 is different from lower conductive line 312. In some embodiments, a thickness of upper conductive line 338 ranges from about 0.1 µm to about 4 µm. In some embodiments, a depth of upper conductive line 338 ranges from about 0.1 µm to about 4 µm.

In some embodiments, first conductive line 306a and second conductive 306b are meandering type conductive line(s) in which a conductive line extends along an angled direction with respect to an x-axis and a y-axis of second IMD layer 326. In some embodiments, conductive lines in a same layer of second IMD layer 326 extend parallel to one another. In some embodiments, conductive lines in a same layer of second IMD layer 326 extend perpendicular to one another.

In some embodiments, a separation between first conductive line 306a and second substrate 320 ranges from about 0.2 µm to about 2 µm. In some embodiments, a separation between second conductive line 306b and second substrate 320 ranges from about 0.2 µm to about 2 µm. In some embodiments, the separation between second conductive line 306b and second substrate 320 is equal to the separation between first conductive line 306a and the second substrate 320. In some embodiments, the separation between second conductive line 306b and second substrate 320 is different from the separation between first conductive line 306a and the second substrate 320.

Figure 3B:
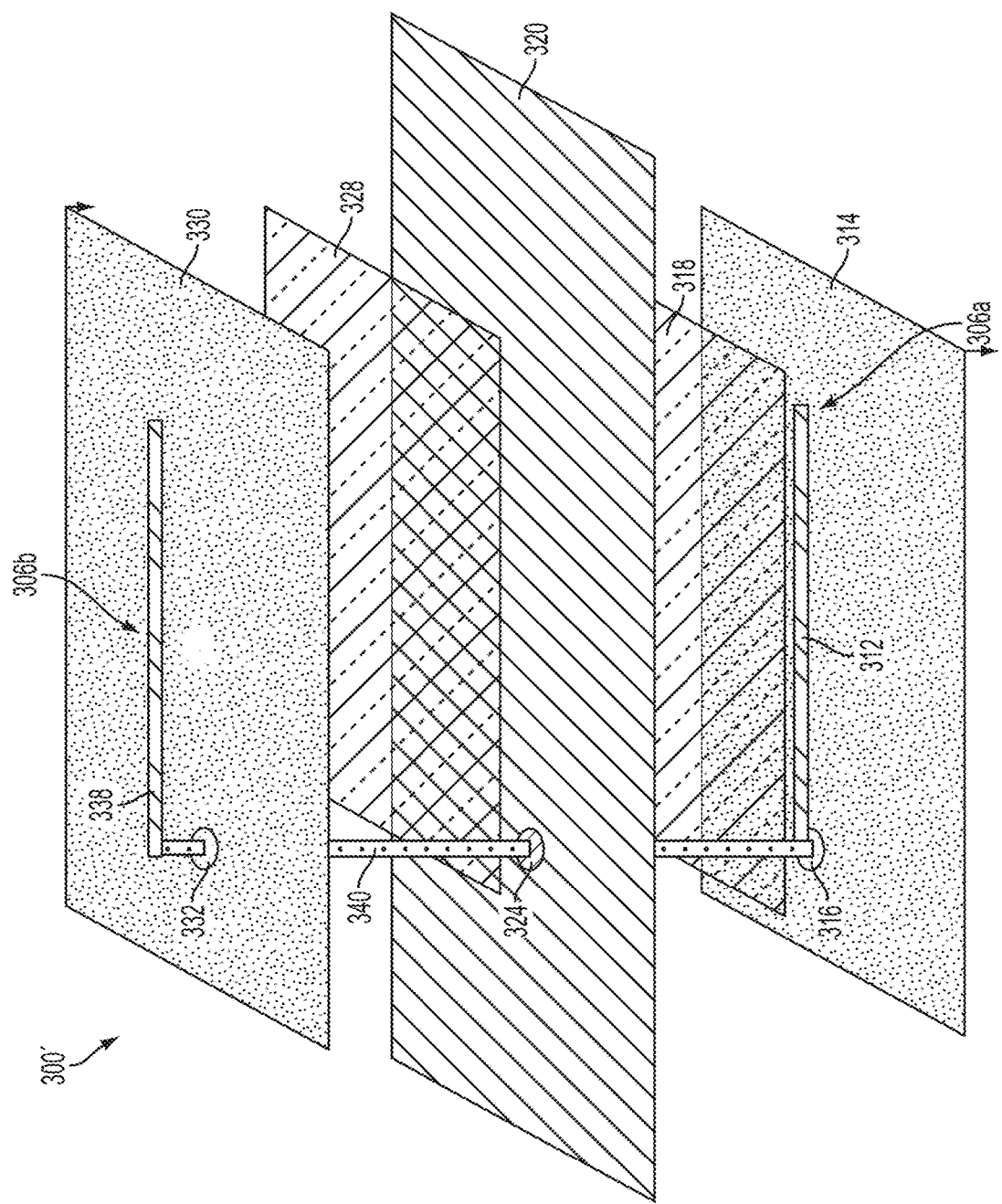
FIG. 3B is a perspective view of an LC transmission line structure in accordance with one or more embodiments.

FIG. 3B is a perspective view of an LC transmission line structure 300' in accordance with one or more embodiments. LC transmission line structure 300' is an embodiment of LC structure 300 with similar elements. As shown in FIG. 3B, similar elements have a same reference number as shown in FIG. 3A. LC transmission line structure 300' is an embodiment of LC transmission line structure 300 without substrate 302, first IMD layer 304 and second IMD layer 326 (for illustrative purposes).

Figure 4A:
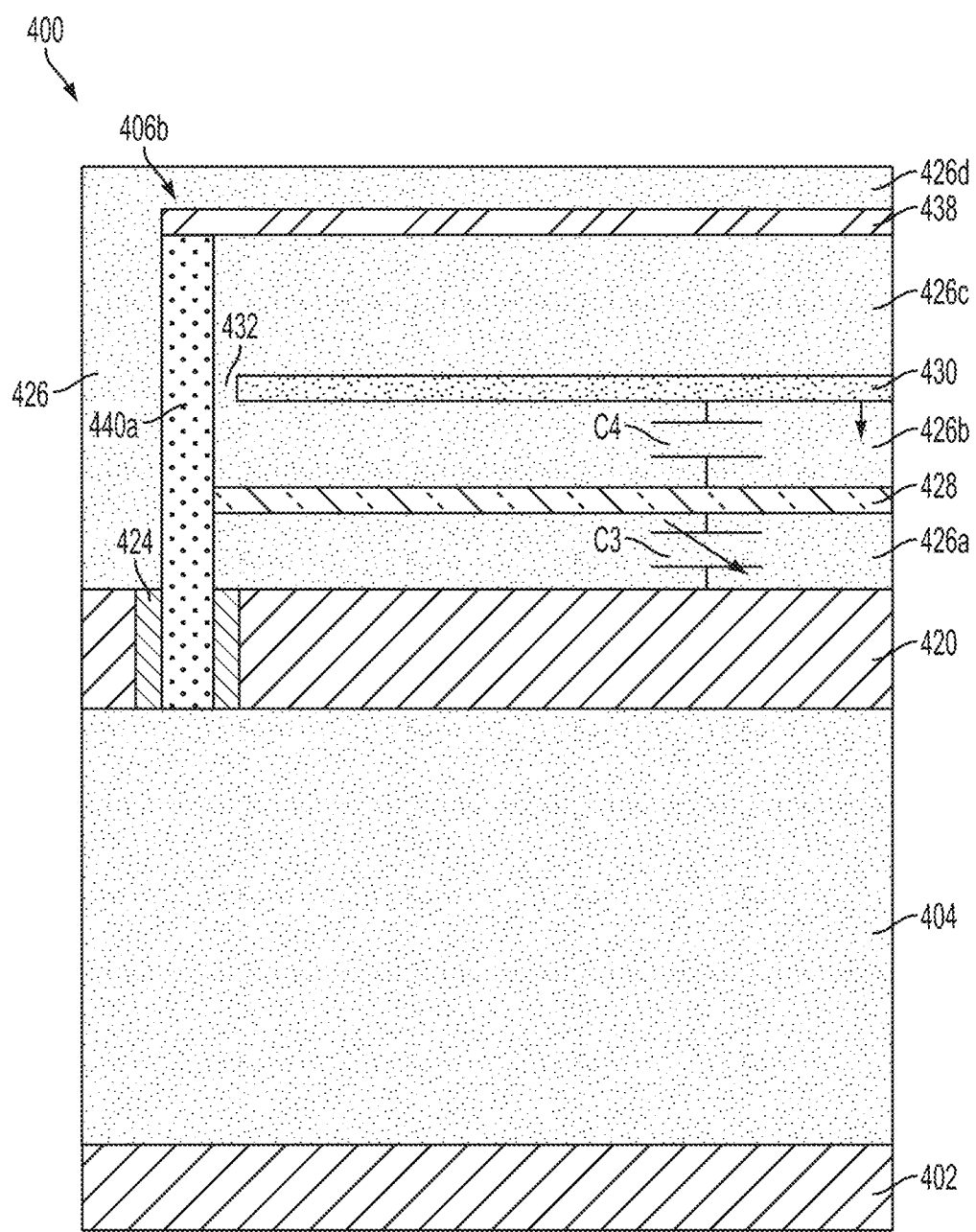
FIG. 4A is a cross sectional view of an LC transmission line structure in accordance with one or more embodiments.

FIG. 4A is a cross sectional view of an LC transmission line structure 400 in accordance with one or more embodiments. LC transmission line structure 400 is an embodiment of LC transmission line structure 300 (shown in FIG. 3A) with similar elements. As shown in FIG. 4A, similar elements have a same reference number as shown in FIG. 3A increased by 100. LC transmission line structure 400 includes second conductive line 406b, upper conductive line 438, second shielding layer 430 and second gate layer 428 in second IMD layer 426. LC transmission line structure 400 includes conductive line 440a. Conductive line 440a is an embodiment of conductive line 340 shown in FIGS. 3A & 3B. Conductive line 440a is used to electrically connect second conductive line 406b to second gate layer 428. In some embodiments, conductive line 440a extends into substrate 420 providing additional capacitance to LC structure 400.

Figure 4B:
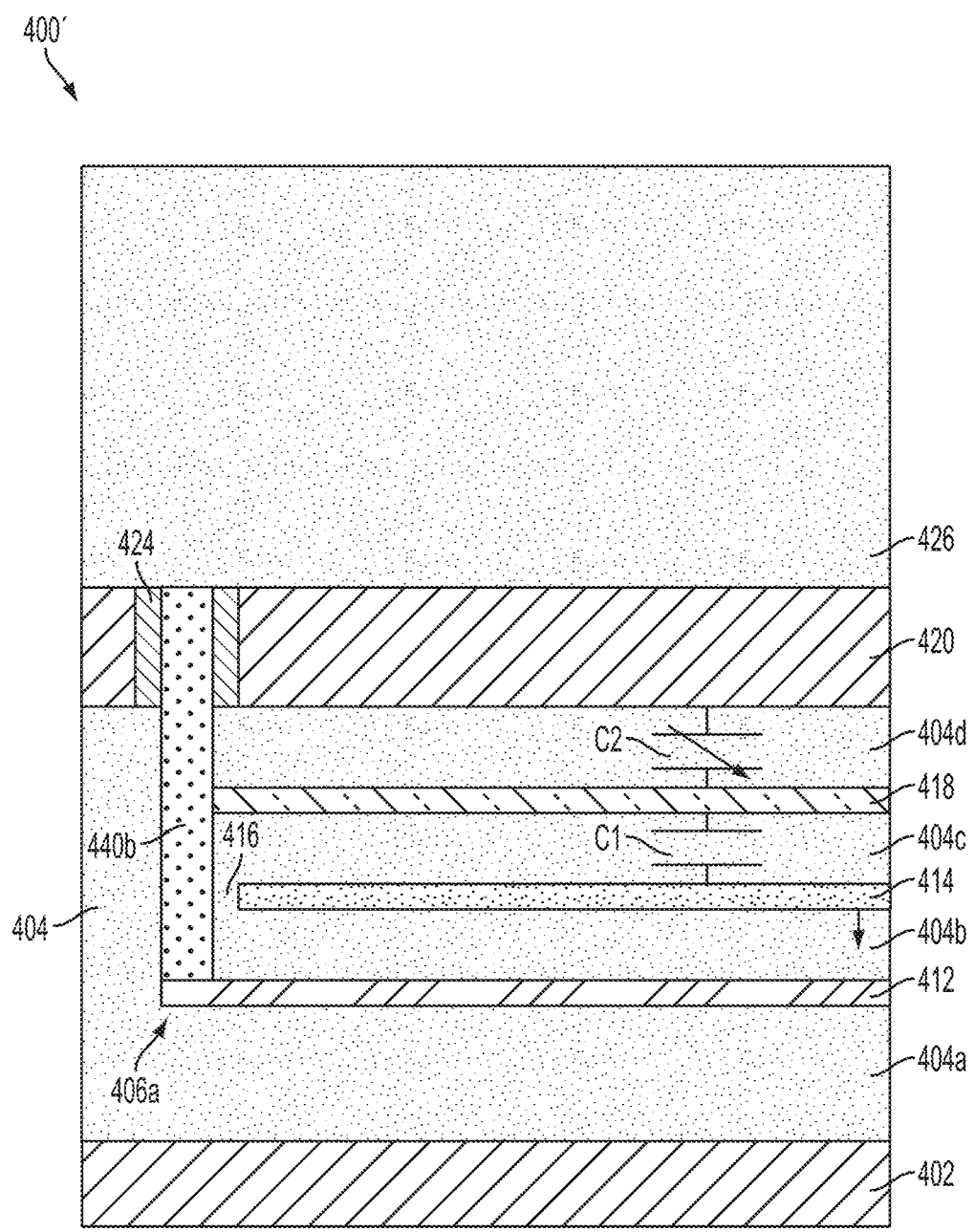
FIG. 4B is a cross sectional view of an LC transmission line structure in accordance with one or more embodiments.

FIG. 4B is a cross sectional view of an LC transmission line structure 400' in accordance with one or more embodiments. LC transmission line structure 400' is an embodiment of LC transmission line structure 300 (shown in FIG. 3A) with similar elements. As shown in FIG. 4B, similar elements have a same reference number as shown in FIG. 3A increased by 100. In comparison with LC transmission line structure 400 (shown in FIG. 4A), LC structure 400' does not include a second conductive line 406b, upper conductive line 438, second shielding layer 430 and second gate layer 428 in a second IMD layer 426. LC transmission line structure 400' includes first conductive line 406a, lower conductive line 412, first shielding layer 414 and first gate layer 418 in first IMD layer 404. LC structure 400' includes conductive line 440b. Conductive line 440b is an embodiment of conductive line 340 shown in FIG. 3. Conductive line 440b is used to electrically connect first conductive line 406a to first gate layer 418. In some embodiments, conductive line 440b extends into substrate 420 providing additional capacitance to LC structure 400'.

Figure 5:
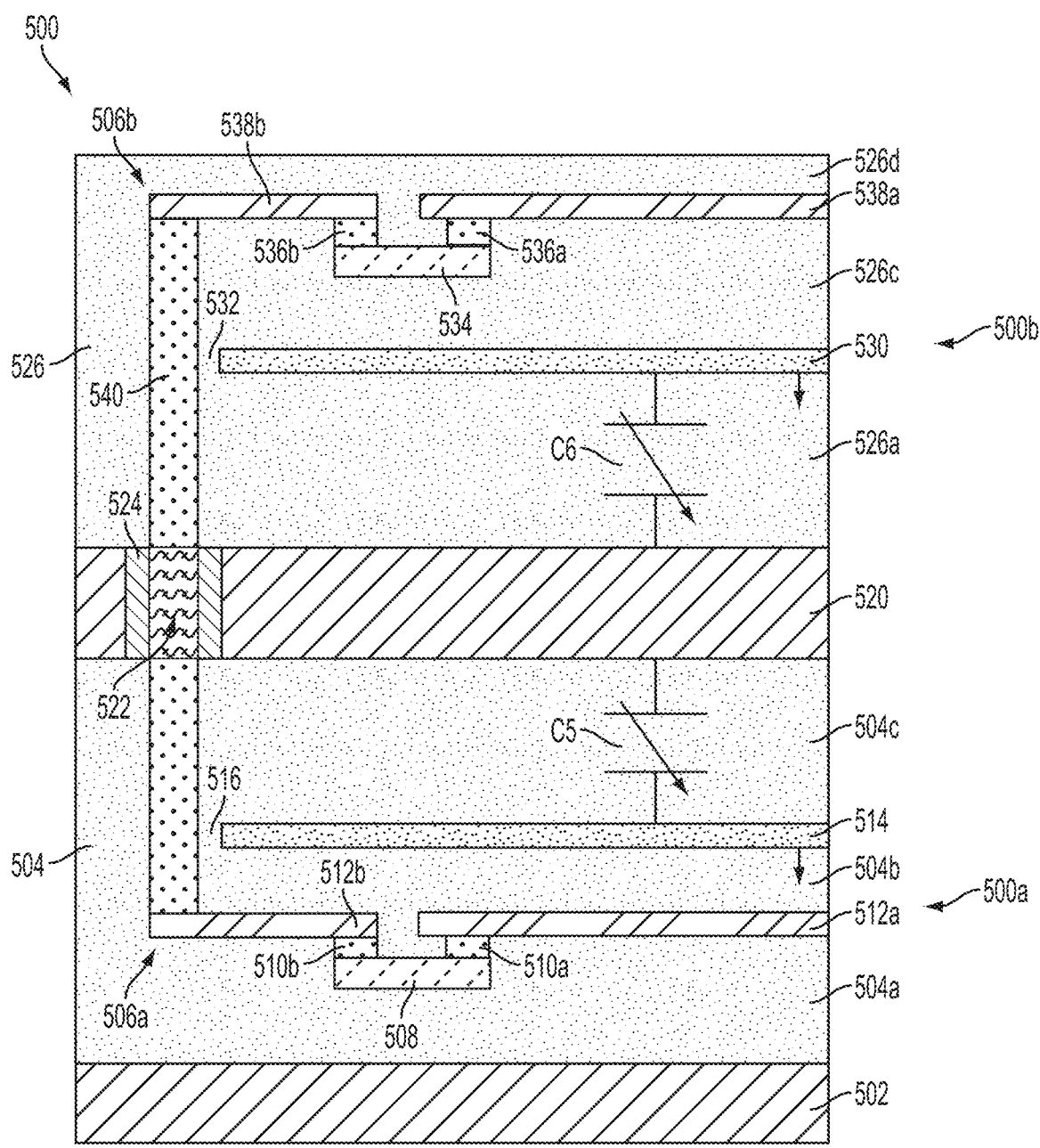
FIG. 5 is a cross sectional view of an LC structure in accordance with one or more embodiments.

FIG. 5 is a cross sectional view of an LC structure 500 in accordance with one or more embodiments. LC structure 500 is an embodiment of LC structure 100 (shown in FIG. 1A) with similar elements. As shown in FIG. 5, similar elements have a same reference number as shown in FIG. 1A increased by 400. In comparison with LC structure 100 (shown in FIG. 1A), LC structure 500 does not include first gate layer 118 and second gate layer 128.

In some embodiments, LC structure 500 is in a stacked configuration with a first LC tank circuit structure 500a located below the second substrate 520, and a second LC tank circuit structure 500b located above the second substrate 520. In some embodiments, first LC tank circuit structure 500a and second LC tank circuit structure 500b operate in a differential mode.

LC structure 500 includes a first shielding layer 514 over the first conductive line 506a. LC structure 500 includes a first IMD layer 504c over the first shielding layer 514. LC structure 500 includes a second substrate 520 over first IMD layer 504c. LC structure 500 includes a second IMD layer 526a over the second substrate 520 and a second shielding layer 530 in second IMD layer 526a. LC structure 500 includes a second IMD layer 526c over the second shielding layer 530 and a second conductive line 506b in second IMD layer 526c. The second conductive line 506b is over the second shielding layer 530. LC structure 500 includes a second IMD layer 526d over the second conductive line 506b. In some embodiments, the second IMD layer 526d is omitted.

Capacitor C5 is the effective capacitance between the first shielding layer 514 and the second substrate 520. In some embodiments, capacitor C5 is referred to as a MOSCAP. The value of capacitor C5 is tunable based on a voltage of first input signal applied to the first conductive line 506a. In some embodiments, the capacitance value of capacitor C5 is increased as the voltage applied to the first conductive line 506a is increased. In some embodiments, the capacitance value of capacitor C5 is decreased as the voltage applied to the first conductive line 506a is decreased. In some embodiments, the value of capacitor C5 is adjusted to tune the first LC tank circuit 500a of LC structure 500. Capacitor C5 has a capacitance between about 30 fF and about 3 pF.

Capacitor C6 is the effective capacitance between the second shielding layer 530 and the second substrate 520. In some embodiments, capacitor C6 is referred to as a MOSCAP. The value of capacitor C6 is tunable based on a voltage of a second input signal applied to the second conductive line 506b. In some embodiments, the capacitance value of capacitor C6 is increased as the voltage applied to the second conductive line 506b is increased. In some embodiments, the capacitance value of capacitor C6 is decreased as the voltage applied to the second conductive line 506b is decreased. In some embodiments, the value of capacitor C6 is adjusted to tune the second LC tank circuit 500b of LC structure 500. Capacitor C6 has a capacitance between about 30 fF and about 3 pF.

Figure 6A:
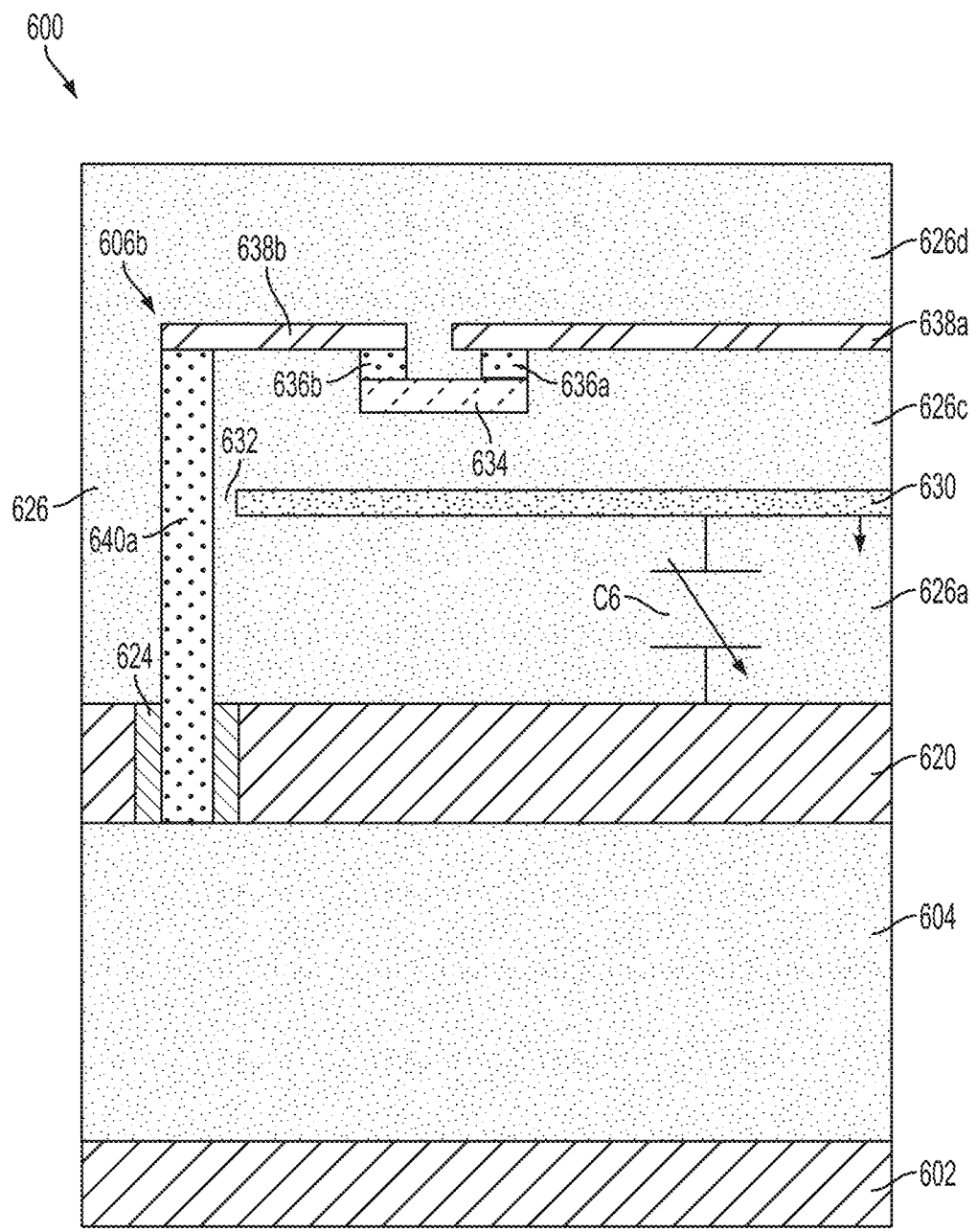
FIG. 6A is a cross sectional view of an LC structure in accordance with one or more embodiments.

FIG. 6A is a cross sectional view of an LC structure 600 in accordance with one or more embodiments. LC structure 600 is an embodiment of LC structure 500 (shown in FIG. 5) with similar elements. As shown in FIG. 6A, similar elements have a same reference number as shown in FIG. 5 increased by 100. LC structure 600 includes second conductive line 606b and second shielding layer 630 in second IMD layer 626. LC structure 600 includes conductive line 640a. Conductive line 640a is an embodiment of conductive line 540 shown in FIG. 5. In some embodiments, insulator 624 is used to electrically isolate conductive line 640a from substrate 620. In some embodiments, substrate 620 is connected to ground.

Figure 6B:
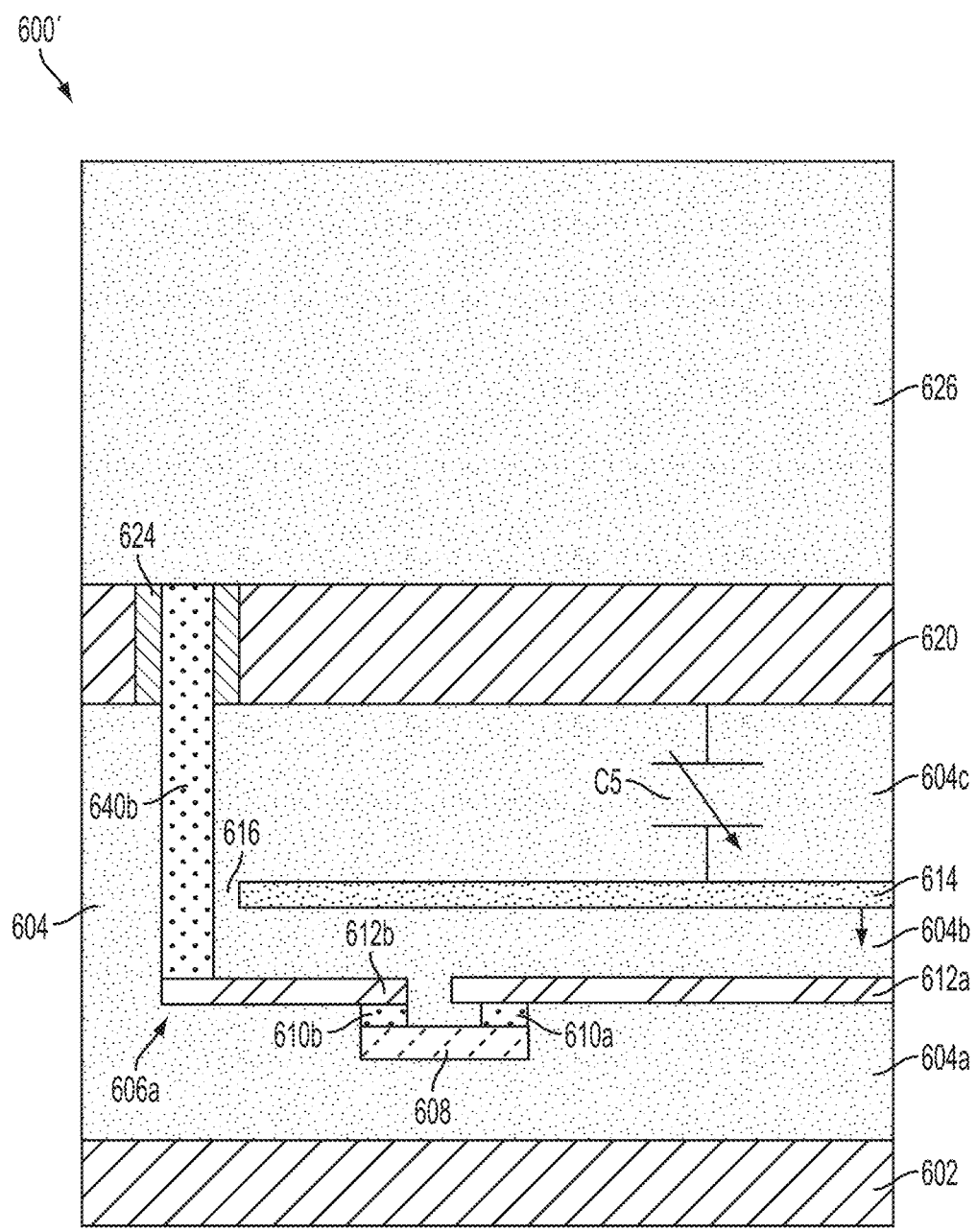
FIG. 6B is a cross sectional view of an LC structure in accordance with one or more embodiments.

FIG. 6B is a cross sectional view of an LC structure 600' in accordance with one or more embodiments. LC structure 600' is an embodiment of LC structure 500 (shown in FIG. 5) with similar elements. As shown in FIG. 6B, similar elements have a same reference number as shown in FIG. 5 increased by 100. In comparison with LC structure 500 (shown in FIG. 5), LC structure 600' does not include a second conductive line 606b and second shielding layer 630 in second IMD layer 626. LC structure 600' includes first conductive line 606a and first shielding layer 614 in first IMD layer 604. LC structure 600' includes conductive line 640b. Conductive line 640b is an embodiment of conductive line 540 shown in FIG. 5. In some embodiments, insulator 624 is used to electrically isolate conductive line 640b from substrate 620. In some embodiments, substrate 620 is connected to ground.

Figure 7:
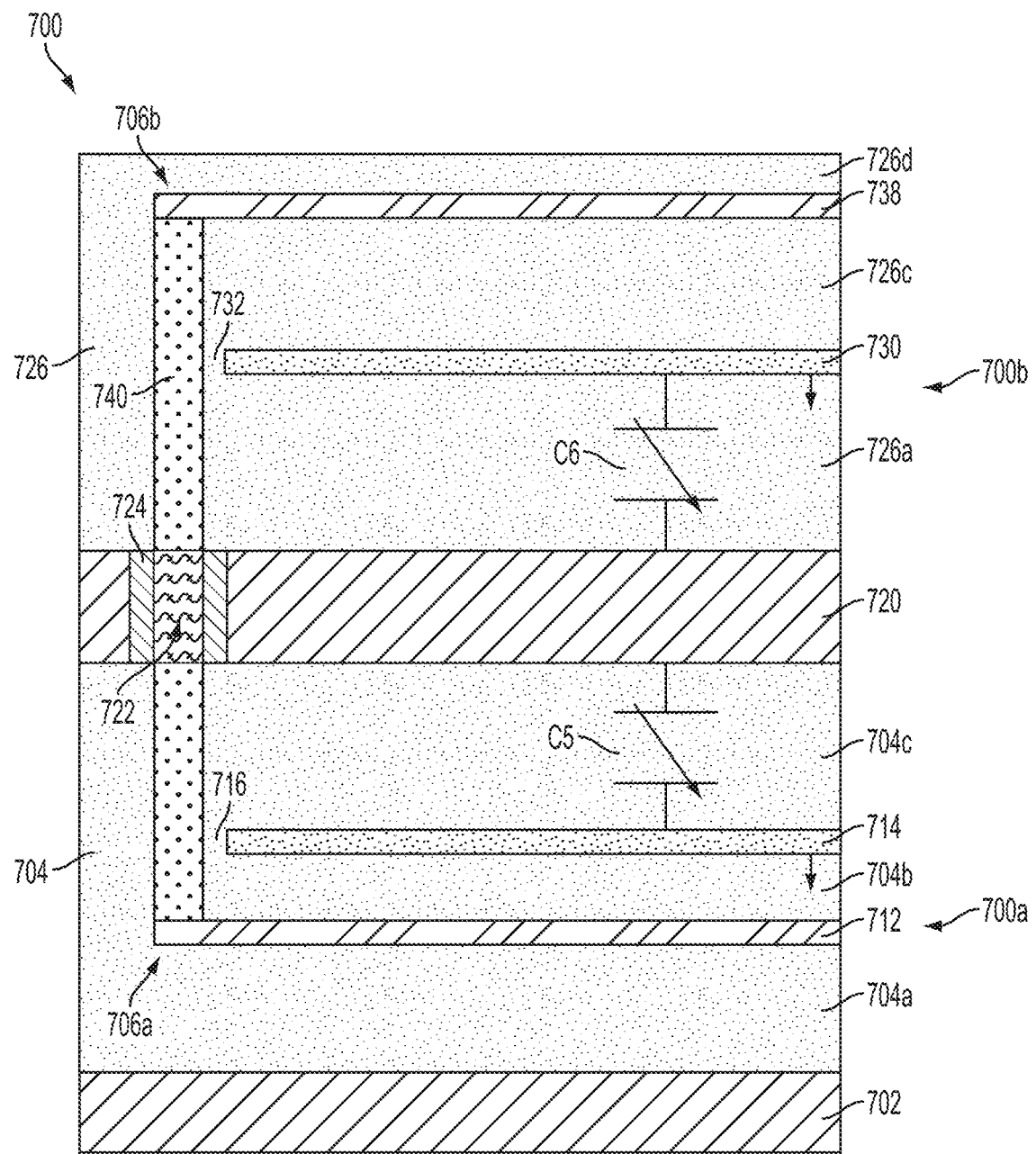
FIG. 7 is a cross sectional view of an LC transmission line structure in accordance with one or more embodiments.

FIG. 7 is a cross sectional view of an LC transmission line structure 700 in accordance with one or more embodiments. LC transmission line structure 700 is an embodiment of LC structure 500 (shown in FIG. 5) with similar elements. As shown in FIG. 7, similar elements have a same reference number as shown in FIG. 5 increased by 200. LC transmission line structure 700 includes first conductive line 706a and second conductive line 706b. In comparison with LC structure 500 (shown in FIG. 5), first conductive line 706a does not include first straight conductive line 512a, second straight conductive line 512b, third straight conductive line 508, first conductive via 510a, and second conductive via 510b. In comparison with LC structure 500 (shown in FIG. 5), second conductive line 706b does not include first straight conductive line 538a, second straight conductive line 538b, third straight conductive line 534, first conductive via 536a, and second conductive via 536b. In some embodiments, LC transmission line structure 700 is in a stacked configuration with a first LC transmission line structure 700a located below the second substrate 720, and a second LC transmission line structure 700b located above the second substrate 720. In some embodiments, first LC transmission line structure 700a and second LC transmission line structure 700b operate in a differential mode.

First conductive line 706a includes lower conductive line 712 in first IMD layer 704. First conductive line 706a is an embodiment of first conductive line 306a shown in FIG. 3A. Lower conductive line 712 is an embodiment of lower conductive line 312 shown in FIG. 3A. Second conductive line 706b includes upper conductive line 738 in second IMD layer 726. Second conductive line 706b is an embodiment of second conductive line 306b shown in FIG. 3B. Upper conductive line 738 is an embodiment of upper conductive line 338 shown in FIG. 3B.

Figure 8A:
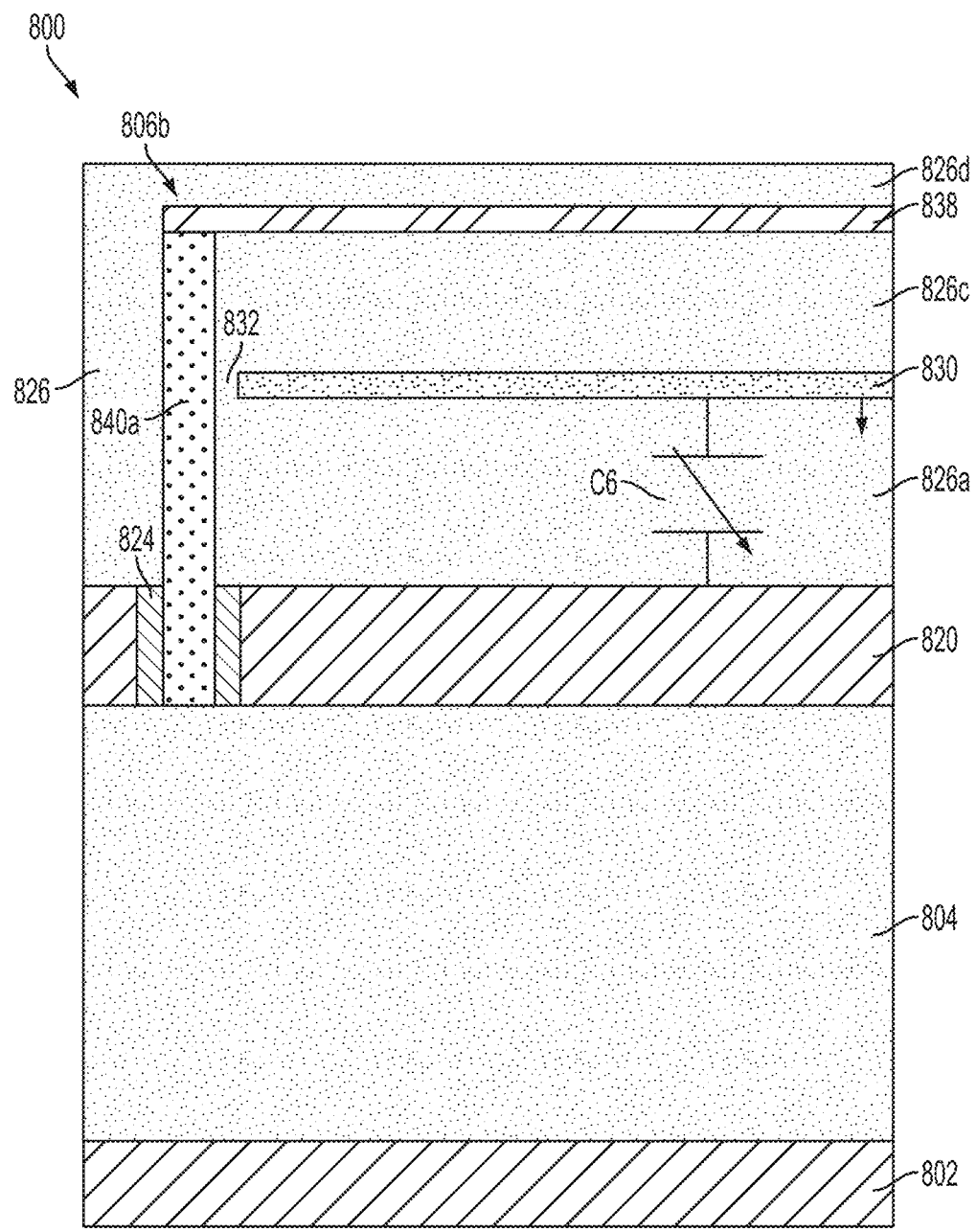
FIG. 8A is a cross sectional view of an LC transmission line structure in accordance with one or more embodiments.

FIG. 8A is a cross sectional view of an LC structure 800 in accordance with one or more embodiments. LC structure 800 is an embodiment of LC structure 600 (shown in FIG. 6) with similar elements. As shown in FIG. 8A, similar elements have a same reference number as shown in FIG. 7 increased by 100. LC structure 800 includes second conductive line 806b and second shielding layer 830 in second IMD layer 826. LC structure 800 includes conductive line 840a. Conductive line 840a is an embodiment of conductive line 740 shown in FIG. 7. In some embodiments, insulator 824 is used to electrically isolate conductive line 840a from substrate 820. In some embodiments, substrate 820 is connected to ground.

Figure 8B:
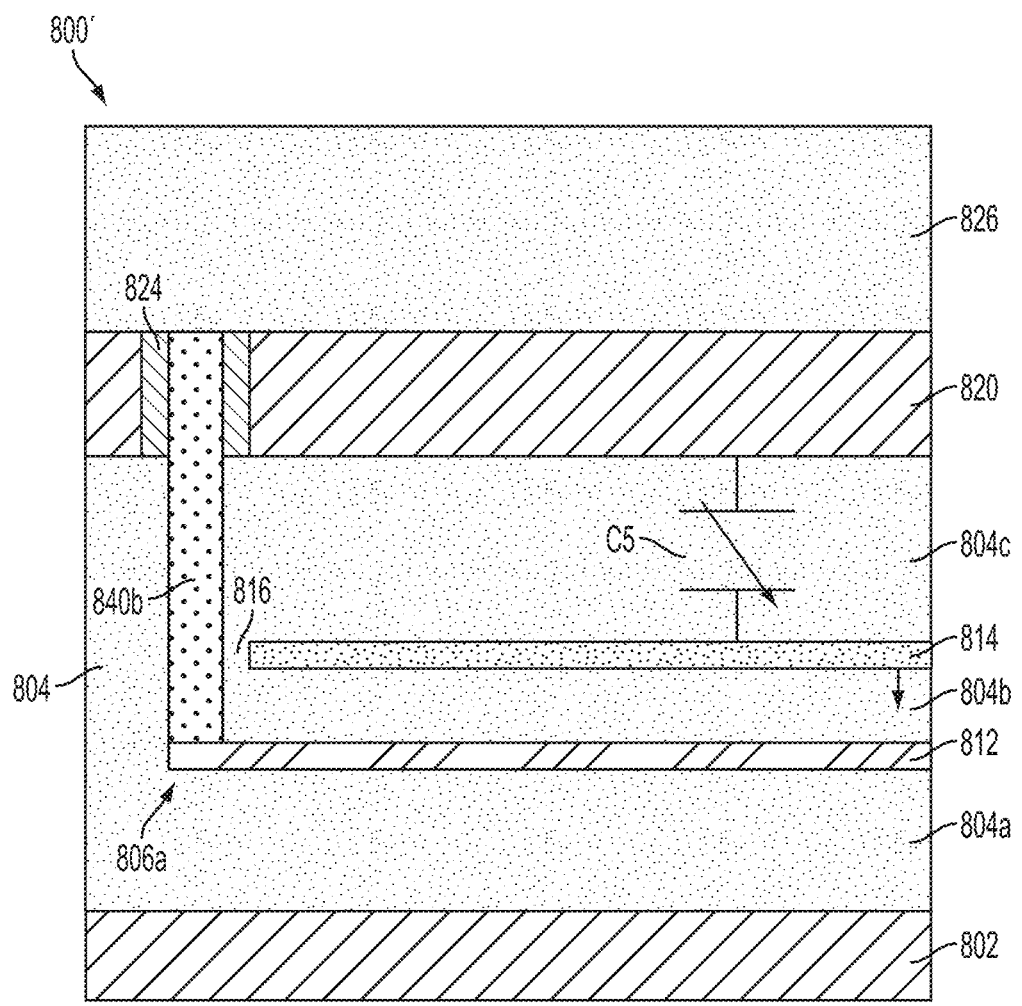
FIG. 8B is a cross sectional view of an LC transmission line structure in accordance with one or more embodiments.

FIG. 8B is a cross sectional view of an LC structure 800' in accordance with one or more embodiments. LC structure 800' is an embodiment of LC structure 700 (shown in FIG. 7) with similar elements. As shown in FIG. 8B, similar elements have a same reference number as shown in FIG. 7 increased by 100. In comparison with LC structure 700 (shown in FIG. 7), LC structure 800' does not include a second conductive line 806b and second shielding layer 830 in second IMD layer 826. LC structure 800' includes first conductive line 806a and first shielding layer 814 in first IMD layer 804. LC structure 800' includes conductive line 840b. Conductive line 840b is an embodiment of conductive line 740 shown in FIG. 7. In some embodiments, insulator 824 is used to electrically isolate conductive line 840b from substrate 820. In some embodiments, substrate 820 is connected to ground.

Figures 9A, 9B:
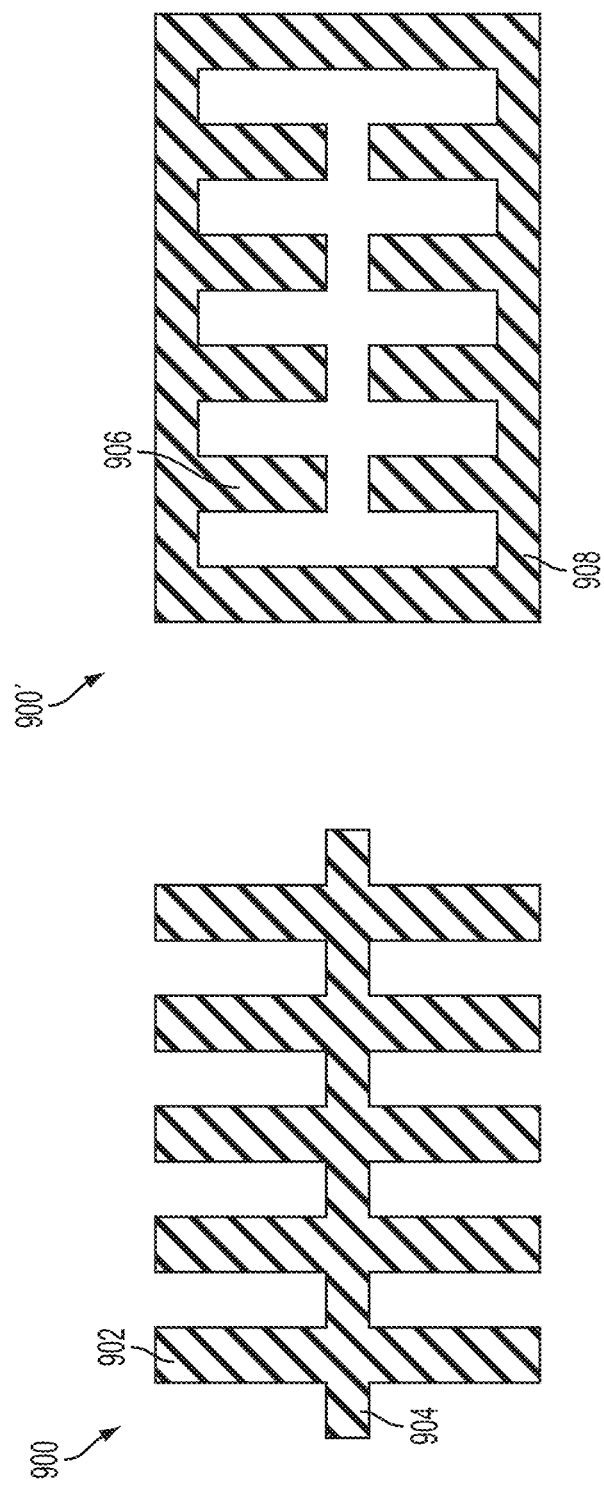
FIG. 9A is a top view of a shielding plate in accordance with one or more embodiments.
FIG. 9B is a top view of a shielding plate in accordance with one or more embodiments.

FIG. 9A is a top view of a shielding plate 900 in accordance with one or more embodiments. Shielding plate 900 is an embodiment of first shielding layer 114 shown in FIG. 1A and first shielding layer 314 shown in FIG. 3A. In some embodiments, shielding plate 900 of FIG. 9A is used in place of or in conjunction with the first shielding layer 114 shown in FIG. 1A and the first shielding layer 314 shown in FIG. 3A.

Shielding plate 900 includes one or more horizontal portions 904 which extend horizontally. In some embodiments, horizontal portions 904 are substantially parallel with other horizontal portions 904. Shielding plate 900 includes one or more vertical portions 902 which extend vertically. In some embodiments, vertical portions 904 are substantially parallel with other vertical portions 904. Shielding plate 900 includes one or more openings 906. In some embodiments, openings 906 extend in a substantially vertical direction. In some embodiments, openings 906 extend in a substantially horizontal direction. In some embodiments, openings 906 extend in a combination of a vertical and horizontal direction. In some embodiments, shielding plate 900 includes a solid conductor with openings 906, formed therein, shaped in various patterns, such as rectangular, square, circular, hexagonal, or other geometric shapes. In at least some embodiments, openings 906 are larger or smaller in size. In some embodiments, openings 906 provide protection from electromagnetic fields since they are small enough to reduce coupling at desired operating frequencies. In some embodiments, openings 906 are smaller than a wavelength for a corresponding frequency.

In some embodiments, shielding plate 900 is a multi-layer structure. In some embodiments, shielding plate 900 is a multi-layer structure which includes one or more shielding plates formed with the same patterns overlapping one another. In some embodiments, shielding plate 900 is a multi-layer structure which includes one or more shielding plates formed with different patterns overlapping one another. In some embodiments, shielding plate 900 is a multi-layer structure which includes one or more shielding plates which partially overlaps one another. In some embodiments, shielding plate 900 is a solid conductor with a plate-like shape. In some embodiments, shielding plate 900 is a single-layer structure.

FIG. 9B is a top view of a shielding plate 900' in accordance with one or more embodiments. Shielding plate 900' is an embodiment of first shielding layer 114 shown in FIG. 1A and first shielding layer 314 shown in FIG. 3A. In some embodiments, shielding plate 900' of FIG. 9B is used in place of or in conjunction with the first shielding layer 114 shown in FIG. 1A and the first shielding layer 314 shown in FIG. 3A.

Shielding plate 900' includes one or more horizontal portions 910 which extend horizontally. In some embodiments, horizontal portions 910 are substantially parallel with other horizontal portions 910. Shielding plate 900' includes one or more vertical portions 908 which extend vertically. In some embodiments, vertical portions 908 are substantially parallel with other vertical portions 908. Shielding plate 900' includes one or more openings 912. In some embodiments, openings 912 extend in a substantially vertical direction. In some embodiments, openings 912 extend in a substantially horizontal direction. In some embodiments, openings 912 extend in a combination of a vertical and horizontal direction. In some embodiments, shielding plate 900' includes a solid conductor with openings 912, formed therein, shaped in various patterns, such as rectangular, square, circular, hexagonal, or other geometric shapes. In at least some embodiments, openings 912 are larger or smaller in size. In some embodiments, openings 912 provide protection from electromagnetic fields since they are small enough to reduce coupling at desired operating frequencies. In some embodiments, openings 912 are smaller than a wavelength for a corresponding frequency.

In some embodiments, shielding plate 900' is a multi-layer structure. In some embodiments, shielding plate 900' is a multi-layer structure which includes one or more shielding plates formed with the same patterns overlapping one another. In some embodiments, shielding plate 900' is a multi-layer structure which includes one or more shielding plates formed with different patterns overlapping one another. In some embodiments, shielding plate 900' is a multi-layer structure which includes one or more shielding plates which partially overlaps one another. In some embodiments, shielding plate 900' is a solid conductor with a plate-like shape. In some embodiments, shielding plate 900' is a single-layer structure.

Figure 10:
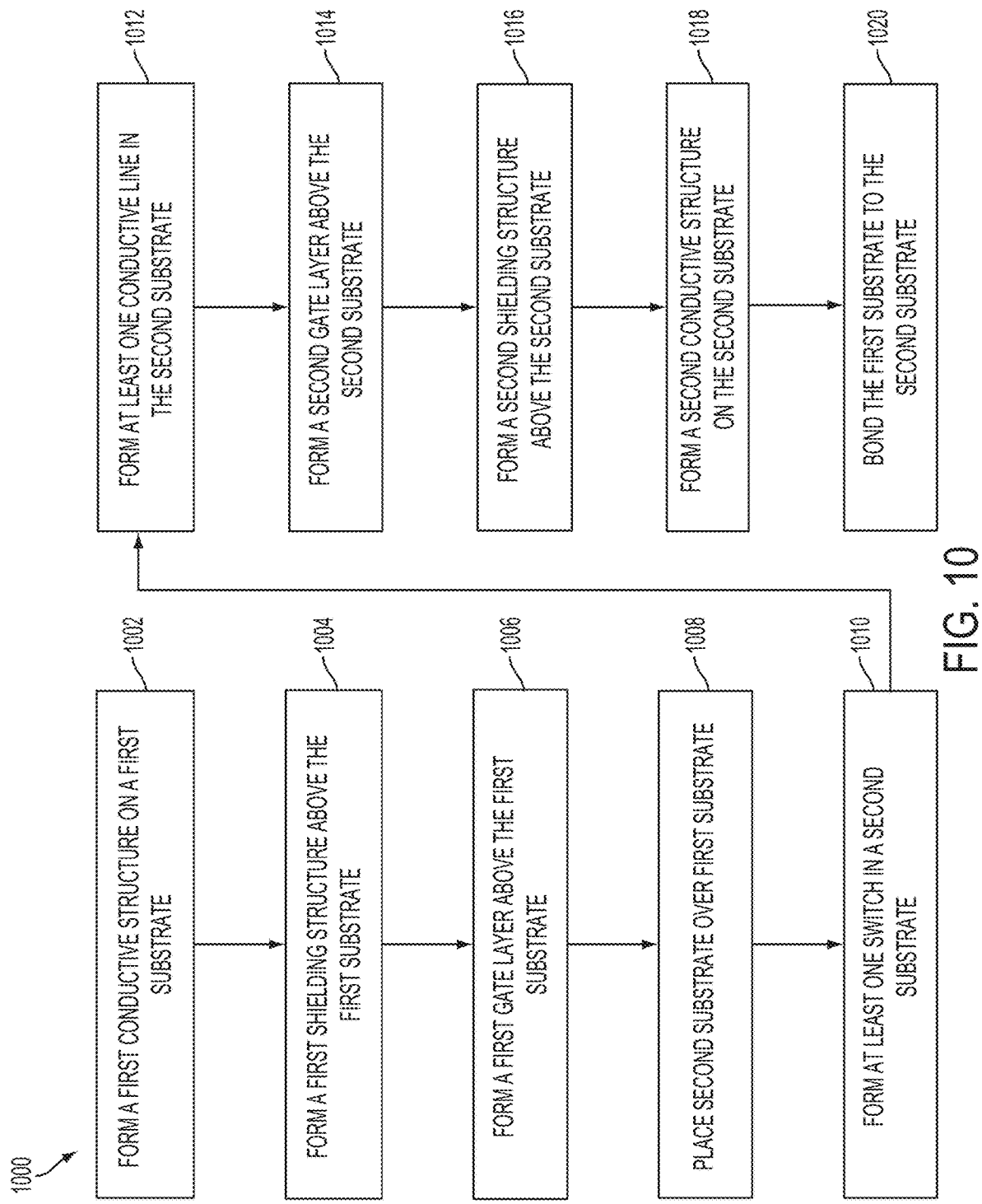
FIG. 10 is a flow chart of a method of making an LC structure in accordance with one or more embodiments.

FIG. 10 is a flow chart of a method 1000 of making an LC structure and an LC transmission line structure in accordance with one or more embodiments. Method 1000 begins with operation 1002 in which a first conductive structure, e.g., first conductive line 106a (FIG. 1A) or first conductive line 306a (FIG. 3A), is formed over a first substrate, e.g., first substrate 102 (FIG. 1A) or first substrate 302 (FIG. 3A). In some embodiments, the first conductive line is formed using a combination of photolithography and etching processes to form openings in an IMD layer, e.g., first IMD layer 104 (FIG. 1A) or first IMD layer 304 (FIG. 3A). In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the etching process is a wet etching process, a dry etching process, a reactive ion etching (RIE) process, or another suitable etching process. The openings are then filled with conductive material, e.g., copper, aluminum, titanium, nickel, tungsten, or other suitable conductive material. In some embodiments, the openings are filled using CVD, PVD, sputtering, atomic layer deposition (ALD) or other suitable formation process.

In some embodiments, operation 1002 is omitted. Operation 1002 is omitted, e.g., in embodiments which do not include a first conductive line between the first substrate and a second substrate, e.g., LC structure 200 and 600 (FIGS. 2A and 6A) and LC transmission line structure 400 and 800 (FIGS. 4A and 8A).

Method 1000 continues with operation 1004 in which first shielding structure, e.g., first shielding structure 114 (FIG. 1A) or first shielding structure 314 (FIG. 3A), is formed over the first substrate, e.g., first substrate 102 (FIG. 1A) or first substrate 302 (FIG. 3A). In some embodiments, the first shielding structure is formed using a combination of photolithography and etching processes to form openings in an IMD layer, e.g., first IMD layer 104 (FIG. 1A) or first IMD layer 304 (FIG. 3A). In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the etching process is a wet etching process, a dry etching process, an RIE process, or another suitable etching process. The openings are then filled with conductive material, e.g., copper, aluminum, titanium, nickel, tungsten, or other suitable conductive material. In some embodiments, the openings are filled using CVD, PVD, sputtering, ALD or other suitable formation process.

In some embodiments, operation 1004 is omitted. Operation 1004 is omitted, e.g., in embodiments which do not include a first shielding layer between the first substrate and a second substrate, e.g., LC structure 200 and 600 (FIGS. 2A and 6A) and LC transmission line structure 400 and 800 (FIGS. 4A and 8A).

Method 1000 continues with operation 1006 in which first gate layer, e.g., first gate layer 118 (FIG. 1A) or first gate layer 318 (FIG. 3A), is formed over the first substrate, e.g., first substrate 102 (FIG. 1A) or first substrate 302 (FIG. 3A). In some embodiments, the first gate layer is formed using a doped or non-doped polycrystalline silicon (or polysilicon). Alternatively, the first gate layer includes a metal, such as Al, Cu, W, Ti, Ta, TiN, TaN, NiSi, CoSi, other suitable conductive materials, or combinations thereof, in some embodiments. In some embodiments, the first gate layer is formed using CVD, PVD, ALD, plating, or other suitable formation processes. In some embodiments, the first gate layer has a multilayer structure and is formed in a multiple-step process. Operation 1006 is omitted, e.g., in embodiments which do not include a first gate layer between the first substrate and a second substrate, e.g., LC structure 200 and 600 (FIGS. 2A and 6A) and LC transmission line structure 400 and 800 (FIGS. 4A and 8A).

Method 1000 continues with operation 1008 in which a second substrate, e.g., second substrate 120 (FIG. 1A) or second substrate 320 (FIG. 3A), is placed over the first substrate. In some embodiments, second substrate includes polysilicon, doped silicon, or other suitable conductive materials.

Method 1000 continues with operation 1010 in which at least one switch, e.g., switch 122 (FIG. 1A) or switch 322 (FIG. 3A), is formed in the second substrate, e.g., second substrate 120 (FIG. 1A) or second substrate 320 (FIG. 3A). In some embodiments, the at least one switch is a MOS, BJT, HEMT or another suitable switching element. In some embodiments, the at least one switch is formed through a combination of implantation processes, deposition process and etching processes. In some embodiments, operation 1010 is omitted when a switch is not utilized.

Method 1000 continues with operation 1012 in which at least one conductive line, e.g., conductive line 140 (FIG. 1A) or conductive line 340 (FIG. 3A), is formed in the second substrate. In some embodiments, the conductive line is formed using a combination of photolithography and material removal processes to form openings in the second substrate. In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the material removal process includes a wet etching process, a dry etching process, an RIE process, laser drilling or another suitable etching process. The openings are then filled with conductive material, e.g., copper, aluminum, titanium, nickel, tungsten, or other suitable conductive material. In some embodiments, the openings are filled using CVD, PVD, sputtering, ALD or other suitable formation process. In some embodiments, operation 1012 is omitted.

Method 1000 continues with operation 1014 in which second gate layer, e.g., second gate layer 128 (FIG. 1A) or second gate layer 328 (FIG. 3A), is formed over the second substrate, e.g., second substrate 120 (FIG. 1A) or second substrate 320 (FIG. 3A). In some embodiments, the second gate layer is formed using a doped or non-doped polycrystalline silicon (or polysilicon). Alternatively, the second gate layer includes a metal, such as Al, Cu, W, Ti, Ta, TiN, TaN, NiSi, CoSi, other suitable conductive materials, or combinations thereof, in some embodiments. In some embodiments, the second gate layer is formed using CVD, PVD, ALD, plating, or other suitable formation processes. In some embodiments, the second gate layer has a multilayer structure and is formed in a multiple-step process.

Operation 1014 is omitted, e.g., in embodiments which do not include a second gate layer over the first substrate and a second substrate, e.g., LC structure 200 and 600 (FIGS. 2B and 6B) and LC transmission line structure 400 and 800 (FIGS. 4B and 8B).

Method 1000 continues with operation 1016 in which second shielding structure, e.g., second shielding structure 130 (FIG. 1A) or second shielding structure 330 (FIG. 3A), is formed on the second substrate, e.g., second substrate 120 (FIG. 1A) or second substrate 320 (FIG. 3A). In some embodiments, the second shielding structure is formed using a combination of photolithography and etching processes to form openings in an IMD layer, e.g., second IMD layer 126 (FIG. 1A) or second IMD layer 326 (FIG. 3A). In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the etching process is a wet etching process, a dry etching process, an RIE process, or another suitable etching process. The openings are then filled with conductive material, e.g., copper, aluminum, titanium, nickel, tungsten, or other suitable conductive material. In some embodiments, the openings are filled using CVD, PVD, sputtering, ALD or other suitable formation process.

In some embodiments, operation 1016 is omitted. Operation 1016 is omitted, e.g., in embodiments which do not include a second shielding layer above the first substrate and second substrate, e.g., LC structure 200 and 600 (FIGS. 2B and 6B) and LC transmission line structure 400 and 800 (FIGS. 4B and 8B).

Method 1000 continues with operation 1018 in which a second conductive structure, e.g., second conductive line 106*b* (FIG. 1A) or second conductive line 306*b* (FIG. 3A), is formed on a second substrate, e.g., second substrate 120 (FIG. 1A) or second substrate 320 (FIG. 3A). In some embodiments, the second conductive line is formed using a combination of photolithography and etching processes to form openings in an IMD layer, e.g., second IMD layer 126 (FIG. 1A) or second IMD layer 326 (FIG. 3A). In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the etching process is a wet etching process, a dry etching process, an RIE process, or another suitable etching process. The openings are then filled with conductive material, e.g., copper, aluminum, titanium, nickel, tungsten, or other suitable conductive material. In some embodiments, the openings are filled using CVD, PVD, sputtering, ALD or other suitable formation process.

In some embodiments, operation 1018 is omitted. Operation 1018 is omitted, e.g., in embodiments which do not include a second conductive line above the first substrate and second substrate, e.g., LC structure 200 and 600 (FIGS. 2B and 6B) and LC transmission line structure 400 and 800 (FIGS. 4B and 8B).

Method 1000 continues with operation 1020 in which the first substrate is bonded to the second substrate. In some embodiments, the first substrate is bonded to the second substrate using a laser bonding process, a conductive adhesive layer, soldering process or another suitable bonding process.

One of ordinary skill in the art would recognize that an order of operations in method 1000 is adjustable. One of ordinary skill in the art would further recognize that additional steps are able to be included in method 1000 without departing from the scope of this description.

One aspect of this description relates to a tank circuit structure. The tank circuit structure includes a first gate layer, a first substrate, a first shielding layer, a first inductor, a second inductor and a first inter metal dielectric (IMD) layer. The first substrate is over the first gate layer. The first shielding layer is over the first gate layer. The first inductor is over the first shielding layer. The second inductor is below the first substrate. The first IMD layer is between the first substrate and the first shielding layer.

Another aspect of this description relates to a tank circuit structure. The tank circuit structure includes a first gate layer, a first substrate over the first gate layer, a first inductor over the first gate layer, a first shielding layer below the first inductor, a second substrate below the first substrate, an inter level via coupled to at least the first inductor, and a first inter metal dielectric (IMD) layer between the second substrate and the first gate layer.

Still another aspect of this description relates to a method of making a tank circuit structure. The method including forming a first gate layer below a first substrate, forming a first inductor over the first gate layer and a second substrate, forming a second inductor below the first substrate, forming a first shielding structure over the second substrate, and forming an inter level via in the first substrate, and electrically connected to the first inductor.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A tank circuit structure comprising:
   a first gate layer;
   a first substrate over the first gate layer;
   a first shielding layer over the first gate layer;
   a first inductor over the first shielding layer;
   a second inductor below the first substrate; and
   a first inter metal dielectric (IMD) layer between the first substrate and the first shielding layer.

2. The tank circuit structure of claim 1, further comprising:
   a second gate layer between the first inductor and the second inductor.

3. The tank circuit structure of claim 1, further comprising:
   a second IMD layer between the first substrate and the first gate layer.

4. The tank circuit structure of claim 1, further comprising:
   at least one switch in the first substrate, wherein the at least one switch is configured to selectively couple the first inductor and the second inductor together.

5. The tank circuit structure of claim 1, wherein the first inductor comprises:
   a first conductive portion extending in a first direction and being on a first level;
   a second conductive portion extending in the first direction and being on a second level different from the first level; and
   a third conductive portion extending in the first direction and being on the second level.

6. The tank circuit structure of claim 5, wherein the first inductor further comprises:
   a first via between the first conductive portion and the second conductive portion, and electrically coupling the first conductive portion and the second conductive portion together; and
   a second via between the second conductive portion and the third conductive portion, and electrically coupling the second conductive portion and the third conductive portion together.

7. The tank circuit structure of claim 1, further comprising:
   a second substrate below the first substrate.

8. The tank circuit structure of claim 7, further comprising:
   a second shielding layer over the second substrate.

9. The tank circuit structure of claim 1, further comprising:

an inter level via configured to electrically couple the first inductor to the second inductor through the first substrate.

10. The tank circuit structure of claim 9, wherein the inter level via is electrically coupled to the first gate layer.

11. A tank circuit structure comprising:
a first gate layer;
a first substrate over the first gate layer;
a first inductor over the first gate layer;
a first shielding layer below the first inductor;
a second substrate below the first substrate;
an inter level via coupled to at least the first inductor; and
a first inter metal dielectric (IMD) layer between the second substrate and the first gate layer.

12. The tank circuit structure of claim 11, wherein the first shielding layer comprises:
a first conductive portion extending in a first direction;
a second conductive portion extending in a second direction different from the first direction, and intersecting the first conductive portion;
a third conductive portion extending in the second direction, separated from the second conductive portion in the first direction, and intersecting the first conductive portion; and
a fourth conductive portion extending in the second direction, separated from the second conductive portion and the third conductive portion in the first direction, and intersecting the first conductive portion.

13. The tank circuit structure of claim 11, further comprising:
a second shielding layer embedded in the first IMD layer, and being between the first substrate and the second substrate.

14. The tank circuit structure of claim 11, further comprising:
a second inductor on an opposite side of the first substrate from the first inductor.

15. The tank circuit structure of claim 11, further comprising:
a second gate layer over the first substrate and below the first inductor.

16. The tank circuit structure of claim 15, wherein the second gate layer is electrically coupled to the inter level via, and the inter level via is configured to electrically connect the second gate layer to the first inductor.

17. A method of making a tank circuit structure, the method comprising:
forming a first gate layer below a first substrate;
forming a first inductor over the first gate layer and a second substrate;
forming a second inductor below the first substrate;
forming a first shielding structure over the second substrate; and
forming an inter level via in the first substrate, and electrically connected to the first inductor.

18. The method of claim 17, further comprising:
forming a second gate layer over the first substrate and below the first shielding structure.

19. The method of claim 17, further comprising:
forming a second shielding structure over the second substrate.

20. The method of claim 19, further comprising:
bonding the second substrate to the first substrate,
wherein the inter level via is further electrically connected to the second inductor.

* * * * *